United States Patent
Min et al.

(10) Patent No.: US 12,312,526 B2
(45) Date of Patent: *May 27, 2025

(54) QUANTUM DOTS AND DEVICES INCLUDING THE SAME

(71) Applicant: SAMSUNG ELECTRONICS CO., LTD., Suwon-si (KR)

(72) Inventors: Jihyun Min, Seoul (KR); Eun Joo Jang, Suwon-si (KR); Yuho Won, Seoul (KR); Hyo Sook Jang, Suwon-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 549 days.

This patent is subject to a terminal disclaimer.

(21) Appl. No.: 17/394,614

(22) Filed: Aug. 5, 2021

(65) Prior Publication Data
US 2022/0041930 A1    Feb. 10, 2022

(30) Foreign Application Priority Data
Aug. 6, 2020   (KR) .................. 10-2020-0098730

(51) Int. Cl.
*C09K 11/88*   (2006.01)
*C09K 11/02*   (2006.01)
(Continued)

(52) U.S. Cl.
CPC .......... *C09K 11/885* (2013.01); *C09K 11/883* (2013.01); *H10K 50/115* (2023.02); *B82Y 20/00* (2013.01); *B82Y 40/00* (2013.01)

(58) Field of Classification Search
CPC ... C09K 11/883; C09K 11/885; C09K 11/565; C09K 11/567; C09K 11/02;
(Continued)

(56) References Cited

U.S. PATENT DOCUMENTS 9,181,472 B2   11/2015   Bartel
9,199,842 B2   12/2015   Dubrow et al.
(Continued)

FOREIGN PATENT DOCUMENTS

CN   108865109 A   11/2018
CN   110240896 A   9/2019
(Continued)

OTHER PUBLICATIONS

Jie Zhang et al., "InP/ZnSe/ZnS quantum dots with strong dual emissions: visible excitonic emission and near-infrared surface defect emission and their application in in vitro and in vivo bioimaging," Journal of Materials Chemistry B, Oct. 2, 2017, pp. 8152-8160, vol. 5.
(Continued)

*Primary Examiner* — Matthew E. Hoban
*Assistant Examiner* — Lynne Edmondson
(74) *Attorney, Agent, or Firm* — CANTOR COLBURN LLP

(57) ABSTRACT

A cadmium free quantum dot including a core including a first semiconductor nanocrystal, and a semiconductor nanocrystal shell disposed on the core, a composition of the semiconductor nanocrystal shell being different from a composition of the first semiconductor nanocrystal, a production method thereof, and a device including the same are disclosed. The semiconductor nanocrystal shell includes a zinc chalcogenide, the zinc chalcogenide includes selenium, tellurium, sulfur, or a combination thereof, and the quantum dot further alkaline an alkaline earth metal.

24 Claims, 10 Drawing Sheets

(51) Int. Cl.
  *C09K 11/56* (2006.01)
  *H10K 50/115* (2023.01)
  *B82Y 20/00* (2011.01)
  *B82Y 40/00* (2011.01)

(58) Field of Classification Search
  CPC .............. C09K 11/025; C01P 2004/64; C01P 2004/84; C01B 19/007
  See application file for complete search history.

(56) References Cited

U.S. PATENT DOCUMENTS

| | | | |
|---|---|---|---|
| 9,732,274 B2 | 8/2017 | Mangum et al. | |
| 9,834,724 B2 | 12/2017 | Kim et al. | |
| 9,890,329 B2 | 2/2018 | Chen et al. | |
| 10,100,248 B2 | 10/2018 | Bartel | |
| 10,647,917 B2 | 5/2020 | Lee et al. | |
| 10,651,339 B2 | 5/2020 | Kim | |
| 10,725,340 B2 | 7/2020 | Park et al. | |
| 10,954,440 B2 | 3/2021 | Won et al. | |
| 10,954,441 B2 | 3/2021 | Kim et al. | |
| 10,978,657 B2 | 4/2021 | Kim et al. | |
| 11,319,487 B2 | 5/2022 | Lee et al. | |
| 11,355,583 B2* | 6/2022 | Kwon | C09K 11/70 |
| 11,538,998 B2 | 12/2022 | Lee et al. | |
| 11,569,468 B2 | 1/2023 | Kim et al. | |
| 11,591,518 B2 | 2/2023 | Won et al. | |
| 11,740,495 B2* | 8/2023 | Kim | C09K 11/62 |
| | | | 428/690 |
| 11,767,472 B2 | 9/2023 | Lee et al. | |
| 11,905,447 B2* | 2/2024 | Hwang | C01B 19/007 |
| 2007/0125983 A1 | 6/2007 | Treadway et al. | |
| 2012/0113672 A1 | 5/2012 | Dubrow et al. | |
| 2016/0214862 A1* | 7/2016 | Kim | C01B 19/007 |
| 2017/0052444 A1 | 2/2017 | Park et al. | |
| 2018/0033856 A1 | 2/2018 | Kwon et al. | |
| 2019/0062628 A1 | 2/2019 | Bartel | |
| 2019/0078017 A1 | 3/2019 | Kahen | |
| 2020/0119298 A1 | 4/2020 | Kim et al. | |
| 2020/0224094 A1 | 7/2020 | Won et al. | |
| 2020/0291295 A1 | 9/2020 | Kahen | |
| 2020/0319516 A1 | 10/2020 | Park et al. | |
| 2021/0183999 A1 | 6/2021 | Kwon et al. | |
| 2021/0207027 A1 | 7/2021 | Won et al. | |
| 2023/0180498 A1 | 6/2023 | Kim et al. | |
| 2023/0212456 A1 | 7/2023 | Won et al. | |

FOREIGN PATENT DOCUMENTS

| | | |
|---|---|---|
| CN | 110246987 A | 9/2019 |
| CN | 110858632 A | 3/2020 |
| CN | 111303011 A | 6/2020 |
| JP | 2010132906 A | 6/2010 |
| JP | 2010529234 A | 8/2010 |
| KR | 20090010412 A | 1/2009 |
| KR | 20150016436 A | 2/2015 |
| KR | 101525524 B1 | 6/2015 |
| KR | 20170107637 A | 9/2017 |
| KR | 20180094200 A | 8/2018 |
| KR | 20190027065 A | 3/2019 |
| KR | 20190046248 A | 5/2019 |
| KR | 101993922 B1 | 6/2019 |
| KR | 20190080836 A | 7/2019 |
| KR | 20190106823 A | 9/2019 |
| KR | 20200059651 A | 5/2020 |
| KR | 20200087715 A | 7/2020 |
| WO | 2018197532 A1 | 11/2018 |
| WO | 2019215060 A1 | 11/2019 |
| WO | 2020132245 A1 | 6/2020 |

OTHER PUBLICATIONS

Zahra Asgari Fard et al., "Investigation of the effect of Sr-doped in ZnSe layers to improve photovoltaic characteristics of ZnSe/CdS/CdSe/ZnSe quantum dot sensitized solar cells," Solar Energy, Apr. 9, 2019, pp. 378-390, vol. 184.

Office Action dated Jan. 4, 2024, of the corresponding Chinese Patent Application No. 202110895450.1.

K. Watanabe et al., "Optical properties of ZnTe/Zn1-xMgxSeyTe1-y quantum wells and epilayers grown by molecular beam epitaxy," J. Appl. Phys., Oct. 1, 1996, pp. 451-455, vol. 81.

Office Action dated May 30, 2024, of the corresponding Chinese Patent Application No. 202111208411.6.

* cited by examiner

QUANTUM DOTS AND DEVICES INCLUDING THE SAME

CROSS-REFERENCE TO RELATED APPLICATION

This application claims priority to and the benefit of Korean Patent Application No. 10-2020-0098730, filed in the Korean Intellectual Property Office on Aug. 6, 2020, and all the benefits accruing therefrom under 35 U.S.C. § 119, the content of which in its entirety is herein incorporated by reference.

BACKGROUND

1. Field

A quantum dot and an electronic device including the quantum dot are disclosed.

2. Description of the Related Art

Unlike a bulk material, physical characteristics (e.g., a bandgap energy) of a semiconductor nanoparticle may be controlled by changing the size of the nanoparticle. For example, a semiconductor nanocrystal particle (also known as a quantum dot) is a nano-sized crystalline material. Because the semiconductor nanocrystal particle has a relatively small size, the nanocrystal particle has a large surface area per a unit volume, and thereby, the particle exhibits a quantum confinement effect and will have different properties than bulk materials of the same chemical composition. A quantum dot may absorb energy from an excitation source, e.g., light or an applied electric current, and upon relaxation to the ground state the quantum dot emits light energy corresponding to a bandgap energy of the quantum dot. In a wet chemical method for producing a quantum dot, organic compounds such as ligands/coordinating solvents may be coordinated on, e.g., bound to, surfaces of nanocrystals to control crystal growth.

SUMMARY

An embodiment provides a cadmium-free semiconductor nanocrystal particle capable of emitting light of a desired wavelength (e.g., blue light) with an improved efficiency.

An embodiment provides a method of producing the cadmium-free semiconductor nanocrystal particle.

An embodiment provides an electronic device, e.g., a display device, including the aforementioned cadmium-free semiconductor nanocrystal particle.

In an embodiment, a quantum dot (or quantum dots) includes a core including a first semiconductor nanocrystal, and a semiconductor nanocrystal shell disposed on the core, a composition of the semiconductor nanocrystal shell being different from a composition of the first semiconductor nanocrystal, wherein the quantum dot does not include cadmium, wherein the semiconductor nanocrystal shell includes a zinc chalcogenide, the zinc chalcogenide includes selenium, tellurium, sulfur, or a combination thereof, and the quantum dot further comprises an alkaline earth metal.

The quantum dot or the first semiconductor nanocrystal may not include an indium phosphide.

The quantum dot or the first semiconductor nanocrystal may not include a Group III-V compound.

The first semiconductor nanocrystal may include zinc, tellurium, and selenium.

In the quantum dot, a mole ratio of tellurium with respect to selenium may be greater than 0:1 and less than or equal to about 0.1:1.

The alkaline earth metal may include barium, strontium, magnesium, calcium, or a combination thereof.

The alkaline earth metal may be present in the semiconductor nanocrystal shell.

The semiconductor nanocrystal shell may include the alkaline earth metal.

The core may not include the alkaline earth metal.

In the quantum dot, an amount of the alkaline earth metal may be greater than or equal to about 0.001 moles and less than or equal to 1 mole, per one mole of zinc.

In the quantum dot, an amount of the alkaline earth metal may be greater than or equal to about 0.003 moles, per one mole of zinc.

In the quantum dot, an amount of the alkaline earth metal may be greater than or equal to about 0.01 moles, per one mole of zinc.

The quantum dot may include a barium sulfide, a calcium sulfide, a magnesium sulfide, a calcium selenide, a barium selenide, a barium zinc selenide, a calcium zinc selenide, a magnesium zinc selenide, or a combination thereof.

The semiconductor nanocrystal shell may include a first shell layer disposed on (e.g., directly on) the core and a second shell layer disposed on (e.g., directly on) the first shell layer, the first shell layer may include a second semiconductor nanocrystal and the second shell layer may include a third semiconductor nanocrystal different (or having a different composition) from the second semiconductor nanocrystal.

The second semiconductor nanocrystal may include zinc and selenium, and optionally sulfur, and the third semiconductor nanocrystal may include sulfur, and optionally zinc, and the second semiconductor nanocrystal, the third semiconductor nanocrystal, or a combination thereof may include the alkaline earth metal.

The second shell layer may be an outermost layer (of the semiconductor nanocrystal shell or the quantum dot) and the third semiconductor nanocrystal may include a zinc sulfide, an alkaline earth metal sulfide, or a combination thereof.

The second semiconductor nanocrystal may include a zinc selenide. The second semiconductor nanocrystal may include an alkaline earth metal zinc selenide. In an embodiment, the second semiconductor nanocrystal may not include an alkaline earth metal. The second semiconductor nanocrystal may not include sulfur.

A maximum luminescent (e.g., photoluminescent) peak wavelength of the quantum dot may be less than or equal to about 480 nanometers (nm). A maximum luminescent peak wavelength of the quantum dot may be greater than or equal to about 430 nm, greater than or equal to about 440 nm, greater than or equal to about 450 nm, or greater than or equal to about 455 nm.

An average particle size of the quantum dot(s) may be greater than or equal to about 7 nm. An average particle size of the quantum dot(s) may be greater than or equal to about 10 nm. An average particle size of the quantum dot(s) may be less than or equal to about 20 nm, or less than or equal to about 16 nm.

The quantum dot may have a (relative or absolute) quantum efficiency of greater than or equal to about 80%. The quantum efficiency of the quantum dot(s) may be greater than or equal to about 85%. The quantum efficiency of the quantum dot(s) may be greater than or equal to about 90%. The quantum efficiency of the quantum dot(s) may be greater than or equal to about 95%.

A maximum luminescent peak of the quantum dot(s) may have a full width at half maximum of less than or equal to about 35 nm.

The quantum dot(s) may include selenium and sulfur and in the quantum dot, a mole ratio of sulfur to selenium (S:Se) may be greater than 0.05:1.

The mole ratio of the sulfur to selenium (S:Se) may be greater than or equal to about 0.1:1, greater than or equal to about 0.11:1, greater than or equal to about 0.3:1, greater than or equal to about 0.5:1, greater than or equal to about 0.6:1, or greater than or equal to about 0.7:1. In the quantum dot, a mole ratio of sulfur to selenium (S:Se) may be less than or equal to about 2:1, less than or equal to about 1.5:1, less than or equal to about 1:1, less than or equal to about 0.95:1, less than or equal to about 0.94:1, less than or equal to about 0.85:1, or less than or equal to about 0.8:1.

In an embodiment, a method of manufacturing the quantum dot(s) includes:
preparing a mixture (e.g., a solution or a dispersion) including (dispersing or dissolving) an alkaline earth metal compound (e.g., an alkaline earth metal carboxylate, an alkaline earth metal halide such as an alkaline earth metal chloride, or a combination thereof) and an organic ligand in an organic solvent;
combining a particle including the core and a chalcogen element precursor with the mixture; and
heating the mixture and conducting a reaction at a reaction temperature and manufacture the quantum dot.

The method may further include adding a zinc precursor to the mixture and a shell layer including a zinc alkaline earth metal chalcogenide may be formed by the reaction on the particle including the core (e.g., on the core).

The particle may further include a semiconductor nanocrystal shell layer disposed on the core and a shell layer including a zinc alkaline earth metal chalcogenide may be formed on the semiconductor nanocrystal shell layer by the reaction.

In an embodiment, an electroluminescent device includes a first electrode and a second electrode spaced with each other (e.g., facing each other), and a quantum dot emission layer including a plurality of quantum dots and disposed between the first electrode and the second electrode, wherein the quantum dots include the aforementioned quantum dot.

The electroluminescent device may further include a charge auxiliary layer between the first electrode and the quantum dot emission layer, between the second electrode and the quantum dot emission layer, or between the first electrode and the quantum dot emission layer and between the second electrode and the quantum dot emission layer.

The charge auxiliary layer may include a charge injection layer, a charge transport layer, or a combination thereof.

A peak external quantum efficiency of the electroluminescent device may be greater than or equal to about 4%.

In an embodiment, an electronic device includes the aforementioned quantum dot(s).

In an embodiment, an electronic device (e.g., a display device) includes a light emitting element (e.g., a photoluminescent element) and optionally a light source, wherein the light emitting element includes a plurality of quantum dots that include the aforementioned quantum dot. If present, the light source may be configured to provide the light emitting element with incident light.

The electroluminescent device or the electronic device may include (or may be) a display device, a light emitting device, a quantum dot light emitting diode, an organic light emitting diode, a sensor, an imaging sensor, a solar cell device, or a combination thereof.

In an embodiment, a quantum dot includes a core including ZnTeSe, and a semiconductor nanocrystal shell disposed on the core, the semiconductor nanocrystal shell including a first shell layer disposed on the core, and a second shell layer disposed on the first shell layer, wherein the semiconductor nanocrystal shell includes ZnS and CaZnSe, BaZnSe, MgZnSe, or a combination thereof, ZnSe and BaS, or a combination thereof (e.g., the first shell layer comprises ZnSe and the second shell layer comprises BaS, or the first shell layer comprises CaZnSe, BaZnSe, MgZnSe, or a combination thereof and the second shell layer comprises ZnS).

In an embodiment, a cadmium free quantum dot capable of emitting light (e.g., of a desired wavelength) with an improved efficiency may be provided. The quantum dot of an embodiment may be applied to, e.g., used in, various display devices, bio-labeling (biosensor, bio-imaging), a photodetector, a solar cell, a hybrid composite, or the like. The quantum dot of an embodiment may exhibit an improved optical property (e.g., a quantum efficiency of 90% or higher) and improved stability (e.g., thermal stability).

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1A:
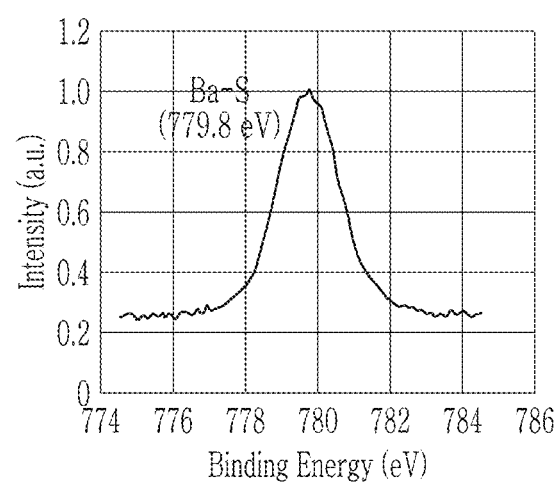
FIG. 1A is a graph of intensity (arbitrary units (a.u.)) versus binding energy (electronvolts (eV)) showing a result of an X-ray photoelectron spectroscopy (XPS) analysis of the quantum dot synthesized in Example 1-1.

Advantages and characteristics of this disclosure, and a method for achieving the same, will become evident referring to the following example embodiments together with the drawings attached hereto. However, the embodiments should not be construed as being limited to the embodiments set forth herein. Rather, these embodiments are provided so that this disclosure will be thorough and complete, and will fully convey the scope of the invention to those skilled in the art.

Unless otherwise defined, all terms used in the specification (including technical and scientific terms) may be used with meanings commonly understood by a person having ordinary knowledge in the art. It will be further understood that terms, such as those defined in commonly dictionary should be interpreted as having a meaning that is consistent with their meaning in the context of the relevant art, and may not be interpreted ideally or exaggeratedly unless clearly defined. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" may refer to replacement of hydrogen of a compound or a group by a substituent of a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, a hydrocarbon or hydrocarbon group refers to a group including (or consisting of) carbon and hydrogen (e.g., an alkyl, alkenyl, alkynyl, or aryl group). The hydrocarbon group may be a group having a valence of one or greater formed by removal of a, e.g., at least one, hydrogen atom from alkane, alkene, alkyne, or arene. In the hydrocarbon group, a, e.g., at least one, methylene may be replaced by an oxide moiety, a carbonyl moiety, an ester moiety, —NH—, or a combination thereof.

As used herein, when a definition is not otherwise provided, "aliphatic" may refers to a saturated or unsaturated linear or branched hydrocarbon group. An aliphatic group may be an alkyl, alkenyl, or alkynyl group, for example.

As used herein, when a definition is not otherwise provided, "alkyl" refers to a linear or branched saturated monovalent hydrocarbon group (methyl, ethyl, hexyl, etc.).

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, "aromatic" refers to an organic compound or group comprising a, e.g., at least one, unsaturated cyclic group having delocalized pi electrons. The term encompasses both hydrocarbon aromatic compounds and heteroaromatic compounds.

As used herein, when a definition is not otherwise provided, "aryl" refers to a group formed by removal of a, e.g., at least one, hydrogen from an aromatic hydrocarbon (e.g., a phenyl or naphthyl group).

As used herein, when a definition is not otherwise provided, "hetero" refers to one including one or more (e.g., 1 to 3) heteroatom of N, O, S, Si, P, or a combination thereof.

As used herein, when a definition is not otherwise provided, "Group" refers to a group of Periodic Table.

As used herein, when a definition is not otherwise provided, "Group III" may refer to Group IIIA and Group IIIB, and examples of Group III metal may be In, Ga, Tl, or a combination thereof, but are not limited thereto.

As used herein, when a definition is not otherwise provided, "Group V" may include nitrogen, phosphorus, arsenic, antimony, bismuth, or a combination thereof but is not limited thereto.

As used herein, when a definition is not otherwise provided, "Group VI" may include sulfur, selenium, tellurium, or a combination thereof, but is not limited thereto.

As used herein, when a definition is not otherwise provided, the expression "not including cadmium (or other harmful heavy metal)" may refer to the case in which a concentration of each of cadmium (or another heavy metal deemed harmful, see below) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other heavy metal) may be present or, if present, an amount of cadmium (or other heavy metal) may be less than or equal to a detection limit or as an impurity level of a given analysis tool (e.g., an inductively coupled plasma atomic emission spectroscopy).

As used herein, when a definition is not otherwise provided, the term "average" used in this disclosure (e.g., an average size of the quantum dot) may be a mean or a median. In an embodiment, the average may be a "mean" average.

As used herein, when a definition is not otherwise provided, the quantum efficiency may be a relative quantum yield or an absolute quantum yield that can be readily measured, for example, by any suitable commercially available equipment. The quantum efficiency (or quantum yield) may be measured in a solution state or a solid state (as in a composite). In an embodiment, "quantum yield (or quantum efficiency)" may be a ratio of photons emitted to photons absorbed by the quantum dot composite, e.g., by a nanostructure or population of nanostructures. In an embodiment, the quantum efficiency may be determined by any suitable method. For example, quantum efficiency may be measured by an absolute method and a relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescent wavelengths, but are not limited thereto.

The quantum yield (QY) may be readily and reproducibly determined by using commercially available equipment, for example, from Hitachi Co. Ltd or Hamamatsu Co. Ltd and referring to the instruction manuals provided from the manufacturer.

The full width at half maximum (FWHM) and the maximum luminescent peak wavelength may be determined by a (photo)luminescent spectrum obtained by a spectrophotometer (or Fluorescence Spectrophotometer).

Semiconductor nanocrystal particles (e.g., quantum dots) may absorb light from an excitation source and may emit light corresponding to a bandgap energy of the quantum dots. The bandgap energy of the quantum dot may vary with the size, the composition, or a combination thereof of the quantum dot. Semiconductor nanocrystals may be used as a light emitting material in various fields such as a display device, an energy device, or a bio light emitting device.

Quantum dots having relatively increased photoluminescence properties may include a toxic heavy metal such as cadmium (Cd), lead (Pb), mercury (Hg), or a combination thereof. A toxic heavy metal such as cadmium may cause environmental issues, health issues, or a combination thereof and is one of the restricted elements under Restriction of Hazardous Substances Directive (RoHS) in many countries. Accordingly, development of a cadmium-free quantum dot having improved photoluminescence characteristics is desired.

A quantum dot of an embodiment and a method of making the quantum dot will be described in detail herein. The quantum dot of an embodiment may exhibit improved optical properties (e.g., enhanced quantum yield) and stability (e.g., thermal stability) while it may not include cadmium.

In an embodiment, a quantum dot(s) includes a core including a first semiconductor nanocrystal, and a semiconductor nanocrystal shell disposed on the core (or at least a portion of a surface of the core) and having a different composition from the first semiconductor nanocrystal. The quantum dots may not include cadmium, lead, mercury, or a combination thereof. The semiconductor nanocrystal shell includes a zinc chalcogenide. The zinc chalcogenide include zinc; and selenium, tellurium, sulfur, or a combination thereof.

The quantum dot or the first semiconductor nanocrystal may not include an indium phosphide, a gallium phosphide, or a combination thereof. The quantum dot or the first semiconductor nanocrystal may not include a Group III-V compound.

The quantum dot (or the core) may include tellurium in a predetermined (a limited) amount. An amount of elemental components included in the quantum dot as described herein may be determined through an appropriate analytical instrument and methods (e.g., an inductively coupled plasma atomic emission spectroscopy (ICP-AES), X-ray photoelectron spectroscopy (XPS), or the like).

In the quantum dot of an embodiment, the core or the first semiconductor nanocrystal may include $ZnTe_xSe_{1-x}$ (wherein x is from about 0 to about 0.2, from about 0.001 to about 0.15, from about 0.003 to about 0.12, from about 0.004 to about 0.11, from about 0.005 to about 0.1, from about 0.005 to about 0.09, from about 0.008 to about 0.08, from about 0.009 to about 0.07, from about 0.01 to about 0.06, or a combination thereof). In the core, by increasing an amount ratio of tellurium with respect to selenium, a maximum luminescent peak wavelength of the quantum dot may increase.

In the core or the first semiconductor nanocrystal, an amount of tellurium may be, per one mole of selenium, greater than or equal to about 0.0001 moles, greater than or equal to about 0.0005 moles, greater than or equal to about 0.001 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, or greater than or equal to about 0.02 moles. In the core or the first semiconductor nanocrystal, an amount of tellurium may be, per one mole of selenium, less than or equal to about 0.1 moles, less than or equal to about 0.09 moles, less than or equal to about 0.08 moles, less than or equal to about 0.07 moles, less than or equal to about 0.06 moles, less than or equal to about 0.055 moles, less than or equal to about 0.053 moles, less than or equal to about 0.05 moles, less than or equal to about 0.049 moles, less than or equal to about 0.048 moles, less than or equal to about 0.047 moles, less than or equal to about 0.046 moles, less than or equal to about 0.045 moles, less than or equal to about 0.044 moles, less than or equal to about 0.043 moles, less than or equal to about 0.042 moles, less than or equal to about 0.041 moles, or less than or equal to about 0.04 moles.

The core or the quantum dot may not include manganese, copper, or a combination thereof. The core or the first semiconductor nanocrystal may not include an alkaline earth metal.

The semiconductor nanocrystal shell includes a zinc chalcogenide. The zinc chalcogenide includes zinc; and selenium, tellurium, sulfur, or a combination thereof. The zinc chalcogenide may include a zinc selenide, a zinc sulfide, a zinc selenide telluride, a zinc selenide sulfide, or a combination thereof.

In the quantum dot of an embodiment, a mole ratio of tellurium to selenium (Te:Se) may be, less than or equal to about 0.1:1, less than or equal to about 0.09:1, less than or equal to about 0.08:1, less than or equal to about 0.07:1, less than or equal to about 0.06:1, less than or equal to about 0.05:1, less than or equal to about 0.04:1, less than or equal to about 0.03:1, less than or equal to about 0.02:1, less than or equal to about 0.015:1, or less than or equal to about 0.01:1, for example, as determined by an inductively coupled plasma atomic emission spectroscopy analysis.

In the quantum dot of an embodiment, a mole ratio of tellurium to selenium may be, greater than or equal to about 0.0001:1, for example, greater than or equal to about 0.0005:1, greater than or equal to about 0.001:1, greater than or equal to about 0.0015:1, greater than or equal to about 0.002:1, greater than or equal to about 0.0025:1, greater than or equal to about 0.003:1, greater than or equal to about 0.0035:1, greater than or equal to about 0.004:1, greater than or equal to about 0.0045:1, greater than or equal to about 0.005:1, greater than or equal to about 0.0055:1, greater than or equal to about 0.006:1, greater than or equal to about 0.0065:1, greater than or equal to about 0.007:1, greater than or equal to about 0.0075:1, greater than or equal to about 0.008:1, greater than or equal to about 0.0085:1, greater than or equal to about 0.009:1, greater than or equal to about 0.0095:1, greater than or equal to about 0.01:1, greater than or equal to about 0.015:1, or greater than or equal to about 0.02:1, for example, as determined by an inductively coupled plasma atomic emission spectroscopy analysis.

In an embodiment, the mole ratio of tellurium to selenium may be from about 0.001:1 to about 0.1:1. In an embodiment, the mole ratio of tellurium to selenium may be from about 0.002:1 to about 0.09:1. In an embodiment, the mole ratio of tellurium to selenium may be from about 0.003:1 to about 0.08:1.

In the quantum dot of an embodiment, a mole ratio of tellurium to zinc may be, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, less than or equal to about 0.01:1, less than or equal to about 0.009:1, less than or equal to about 0.008:1, less than or equal to about 0.007:1, less than or equal to about 0.006:1, or less than or equal to about 0.005:1, for example, as determined by an inductively coupled plasma atomic emission spectroscopy analysis. In an embodiment, the mole ratio of tellurium to zinc may be greater than or equal to about 0.0005:1, greater than or equal to about 0.001:1, greater than or equal to about 0.0015:1, greater than or equal to about 0.002:1, greater than or equal to about 0.0025:1, greater than or equal to about 0.003:1, or greater than or equal to about 0.0035:1.

In the quantum dot of an embodiment, a mole ratio of selenium (Se) to zinc (Zn) may be less than or equal to about 1:1, less than or equal to about 0.99:1, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, or less than or equal to about 0.45:1, for example, as determined by an inductively coupled plasma atomic emission spectroscopy analysis. In the quantum dot of an embodiment, a mole ratio of selenium (Se) to zinc (Zn) may be greater than or equal to about 0.1:1, greater than or equal to about 0.2:1, greater than or equal to about 0.3:1, greater than or equal to about 0.4:1, or greater than or equal to about 0.45:1, for example, as determined by an inductively coupled plasma atomic emission spectroscopy analysis.

In the quantum dot of an embodiment, a mole ratio of sulfur to zinc (Zn) may be greater than or equal to about 0.05:1, greater than or equal to about 0.09:1, greater than or equal to about 0.1:1, greater than or equal to about 0.15:1, greater than or equal to about 0.2:1, greater than or equal to about 0.3:1, greater than or equal to about 0.4:1, for example, as determined by an inductively coupled plasma atomic emission spectroscopy analysis. In the quantum dot of an embodiment, a mole ratio of sulfur to zinc (Zn) may be less than or equal to about 0.9:1, less than or equal to about 0.8:1, less than or equal to about 0.7:1, less than or equal to about 0.65:1, less than or equal to about 0.6:1, less than or equal to about 0.55:1, less than or equal to about 0.5:1, less than or equal to about 0.45:1, for example, as determined by an inductively coupled plasma atomic emission spectroscopy analysis.

In the quantum dot of an embodiment, a mole ratio of sulfur to selenium (S:Se) may be less than or equal to about 2:1, less than or equal to about 1.5:1, less than or equal to about 1:1, less than or equal to about 0.95:1, less than or equal to about 0.94:1, less than or equal to about 0.93:1, less than or equal to about 0.92:1, less than or equal to about 0.91:1, less than or equal to about 0.9:1, less than or equal to about 0.89:1, less than or equal to about 0.88:1, less than or equal to about 0.87:1, less than or equal to about 0.86:1, less than or equal to about 0.85:1, less than or equal to about 0.84:1, less than or equal to about 0.83:1, less than or equal to about 0.82:1, less than or equal to about 0.81:1, less than or equal to about 0.80:1, for example, as determined by an inductively coupled plasma atomic emission spectroscopy analysis. In the quantum dot of an embodiment, a mole ratio of sulfur to selenium (S:Se) may be greater than or equal to about 0.1:1, greater than or equal to about 0.11:1, greater than or equal to about 0.12:1, greater than or equal to about 0.13:1, greater than or equal to about 0.14:1, greater than or equal to about 0.15:1, greater than or equal to about 0.2:1, greater than or equal to about 0.3:1, greater than or equal to about 0.4:1, greater than or equal to about 0.5:1, greater than or equal to about 0.6:1, greater than or equal to about 0.7:1, greater than or equal to about 0.71:1, greater than or equal to about 0.72:1, or greater than or equal to about 0.73:1, for example, as determined by an inductively coupled plasma atomic emission spectroscopy analysis.

The quantum dot of an embodiment further includes an alkaline earth metal.

The present inventors have found that the quantum dot having a zinc chalcogenide based core and not including cadmium may emit light of a desired wavelength (e.g., in a green or blue range), for example, the wavelength of light that a Group III-V compound based quantum dot may have difficult to emit. The present inventors have also found that while introducing an inorganic shell (such as a zinc chalcogenide shell for example, a ZnSe, ZnS, or ZnSeS shell) on the zinc chalcogenide core (e.g., ZnSeTe core) may improve a luminous efficiency of the quantum dot, the extent of such an improvement may be quite limited or insufficient. Without wishing to be bound by any theory, it is believed that while a core based on the Group III-V compound (e.g., InP) may have a relatively large difference in a bandgap energy from the zinc chalcogenide shell, the zinc chalcogenide core may have a relatively small or insufficient difference in a bandgap energy from the zinc chalcogenide shell (see Table 1), thus, in case of a quantum dot of a zinc chalcogenide core/a zinc chalcogenide shell, it may be difficult to control/adjust the offsets between the conduction bands of the given core and shell materials and to achieve a desired band alignment therebetween, for example, that is as sufficiently large as in the indium phosphide quantum dot. Accordingly, without wishing to be bound by any theory, it is believed that the band offset alignment of a final quantum dot may not sufficiently contribute to the improvement of the quantum yield or may even have an adverse effect thereon.

In an embodiment, the quantum dot includes the semiconductor nanocrystal shell further including an alkaline earth metal, and exhibits an improved quantum efficiency. Without wishing to be bound by any theory, as the alkaline earth metal included in the semiconductor nanocrystal shell have substantially the same valence as the zinc, readily forming a chalcogenide in the semiconductor nanocrystal shell, and the alkaline earth metal chalcogenide thus formed may have a lattice constant similar to that of the zinc chalcogenide. In an embodiment, a difference between the lattice constant of the alkaline earth metal chalcogenide thus formed and the lattice constant of the zinc chalcogenide may be less than or equal to about 0.1, less than or equal to about 0.09, or less than or equal to about 0.08. In addition, without wishing to be bound by any theory, it is believed that as the alkaline earth metal chalcogenide may provide a wider, e.g., greater, bandgap energy, including the alkaline earth metal chalcogenide in the shell may allow a relatively sufficient shell bandgap modulation and the shell providing the modulated bandgap alignment may further contribute to improving a quantum confinement effect of a given quantum dot.

TABLE 1

| material | Bandgap energy |
| --- | --- |
| InP | 1.34 eV |
| ZnSe | 2.82 eV |
| ZnS | 3.68 eV |
| ZnTeSe | about 2.6 eV |
| MgS | 6.4 eV |
| CaS | 5.0 eV |
| SrS | 4.5 eV |
| BaS | 3.9 eV |

The alkaline earth metal may be one or a combination of any of the elements beryllium, magnesium, calcium, strontium, barium, and radium, occupying Group IIA (2) of the Periodic Table of the Elements. In an embodiment, the alkaline earth metal may include barium, magnesium, strontium, calcium, or a combination thereof. In an embodiment, the alkaline earth metal may include calcium, barium, magnesium, or a combination thereof. The alkaline earth metal may be included in the semiconductor nanocrystal shell. In the quantum dot, an amount of the alkaline earth metal may be, per one mole of zinc, greater than or equal to about 0.0005 moles, greater than or equal to about 0.001 moles, greater than or equal to about 0.002 moles, greater than or equal to about 0.003 moles, greater than or equal to about 0.004 moles, greater than or equal to about 0.005 moles, greater than or equal to about 0.006 moles, greater than or equal to about 0.007 moles, greater than or equal to about 0.008 moles, greater than or equal to about 0.009 moles, greater than or equal to about 0.01 moles, greater than or equal to about 0.02 moles, greater than or equal to about 0.03 moles, greater than or equal to about 0.04 moles, greater than or equal to about 0.05 moles, greater than or equal to about 0.06 moles, greater than or equal to about 0.07 moles, greater than or equal to about 0.08 moles, greater than or equal to about 0.09 moles, or greater than or equal to about 0.1 moles.

In the quantum dot, an amount of the alkaline earth metal may be, per one mole of zinc, less than about 1 mole, less than or equal to about 0.9 moles, less than or equal to about 0.8 moles, less than or equal to about 0.7 moles, less than or equal to about 0.6 moles, less than or equal to about 0.5 moles, less than or equal to about 0.4 moles, less than or equal to about 0.3 moles, less than or equal to about 0.25 moles, less than or equal to about 0.2 moles, less than or equal to about 0.17 moles, less than or equal to about 0.15 moles, less than or equal to about 0.13 moles, less than or equal to about 0.12 moles, less than or equal to about 0.11 moles, less than or equal to about 0.1 moles, less than or equal to about 0.09 moles, less than or equal to about 0.08 moles, less than or equal to about 0.07 moles, or less than or equal to about 0.06 moles. The amount of the alkaline earth metal may be determined by an XPS or ICP-AES analysis, but it is not limited thereto.

The quantum dot or the semiconductor nanocrystal shell may include an alkaline earth metal sulfide, an alkaline earth metal selenide, or a combination thereof. The quantum dot or the semiconductor nanocrystal shell may include barium sulfide, calcium sulfide, magnesium sulfide, calcium selenide, barium zinc selenide, calcium zinc selenide, magnesium zinc selenide, or a combination thereof. In an embodiment, by the inclusion of the alkaline earth metal sulfide, the quantum dot may exhibit further improved optical properties.

The semiconductor nanocrystal shell may be a multilayered shell including a plurality of layers. In the plurality of layers of the shell, adjacent layers may have semiconductor nanocrystal material of different compositions. The semiconductor nanocrystal shell may include a first shell layer disposed on (e.g., directly on) the core and a second shell layer disposed on (e.g., directly on) the first shell layer. The first shell layer may include a second semiconductor nanocrystal. The second shell layer may include a third semiconductor nanocrystal having a composition different from the second semiconductor nanocrystal.

The second semiconductor nanocrystal may include zinc and selenium, and optionally sulfur. The second semiconductor nanocrystal may not include sulfur. The third semiconductor nanocrystal may include sulfur and optionally zinc. The second semiconductor nanocrystal, the third semiconductor nanocrystal, or a combination thereof may include the alkaline earth metal. The second shell layer may be an outermost shell layer of the shell or the quantum dot. The third semiconductor nanocrystal may include a zinc sulfide, an alkaline earth metal sulfide, or a combination thereof.

The second semiconductor nanocrystal may include a zinc selenide. The second semiconductor nanocrystal may include an alkaline earth metal zinc selenide. The first shell layer or the second semiconductor nanocrystal may not include sulfur. The second semiconductor nanocrystal may include CaZnSe, MgZnSe, BaZnSe, SrZnSe, or a combination thereof. The third semiconductor nanocrystal may include a zinc sulfide or may consist of ZnS.

In an embodiment, the second semiconductor nanocrystal may not include an alkaline earth metal. In this embodiment or other embodiments, the third semiconductor nanocrystal may include an alkaline earth metal sulfide. In an embodiment, a third shell layer may be disposed between the first shell layer and the second shell layer and may include a fourth semiconductor nanocrystal different from the second semiconductor nanocrystal and the third semiconductor nanocrystal. The fourth semiconductor nanocrystal may include (or may consist of) a zinc sulfide, a zinc selenide sulfide, or a combination thereof.

In an embodiment, the shell or each of the shell layers in the multi-layered shell may include a gradient alloy having a composition varying in a direction of a radius, e.g., a radial direction from the core toward an outermost surface of the quantum dot. In an embodiment, an amount of the sulfur in the semiconductor nanocrystal shell may increase toward a surface of the quantum dot. For example, in the shell, the amount of the sulfur may increase in a direction away from the core, e.g., in a radial direction from the core toward an outermost surface of the quantum dot.

The quantum dot may have any suitable shape. For example, the quantum dot may have a spherical shape, a polyhedron shape, a multi-pod shape, or a combination thereof. In an embodiment, the quantum dot may have a multi-pod shape. The multi-pod shape may have at least two (e.g., at least three or at least four) branch portions and a valley portion therebetween.

A size (or an average size) of the core may be greater than or equal to about 2 nm, greater than or equal to about 3 nm, or greater than or equal to about 4 nm. The average size of the core may be less than or equal to about 6 nm, for example less than or equal to about 5 nm. In an embodiment, the quantum dot may have a size (or an average size) of greater than or equal to about 10 nm, for example greater than or equal to about 11 nm, or greater than or equal to about 12 nm. Herein, the size of the quantum dot may be a diameter (or a diameter calculated by assuming a sphere from an electron microscope two-dimensional image of the quantum dot if the quantum dot is not a sphere). A size (or an average size) of the semiconductor nanocrystal may be less than or equal to about 50 nm, for example, less than or equal to about 45 nm, less than or equal to about 40 nm, less than or equal to about 35 nm, less than or equal to about 30 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, or less than or equal to about 16 nm.

A thickness of the semiconductor nanocrystal shell may be selected appropriately. A thickness of the semiconductor nanocrystal shell (or the first shell layer, the second shell layer, the third shell layer, or a combination thereof) may be greater than or equal to about 0.3 nm, greater than or equal to about 0.4 nm, greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, or greater than or equal to about 2 nm. A thickness of the semiconductor nanocrystal shell (or the first shell layer, the second shell layer, the third shell layer, or a combination thereof) may be less than or equal to about 4 nm, less than or equal to about 3 nm, less than or equal to about 2.5 nm, less than or equal to about 2 nm, less than or equal to about 1.9 nm, less than or equal to about 1.8 nm, less than or equal to about 1.7 nm, less than or equal to about 1.6 nm, or less than or equal to about 1.5 nm.

A maximum luminescent (e.g., photoluminescent) peak wavelength of the quantum dot may be less than or equal to about 580 nm. A maximum luminescent (e.g., photoluminescent) peak wavelength of the quantum dot may be less than or equal to about 480 nm. A maximum luminescent peak wavelength of the quantum dot may be greater than or equal to about 430 nm, greater than or equal to about 440 nm, greater than or equal to about 450 nm, or greater than or equal to about 455 nm. In an embodiment, the quantum dot may emit light having a maximum luminescent peak wavelength of greater than or equal to about 430 nm (for example, greater than or equal to about 440 nm, greater than or equal to about 445 nm, greater than or equal to about 447 nm, greater than or equal to about 448 nm, greater than or equal to about 449 nm, or greater than or equal to about 450 nm) and less than or equal to about 480 nm (for example, less than or equal to about 475 nm, less than or equal to about 470 nm, less than or equal to about 465 nm, less than or equal to about 460 nm, or less than or equal to about 455 nm). The blue light may have a luminescent peak wavelength of from about 450 nm to about 480 nm, from about 460 nm to about 475 nm, from about 460 nm to about 470 nm, or in a range of a combined range thereof.

The quantum dot may have a (relative or absolute) quantum efficiency of greater than or equal to about 80%. The quantum efficiency of the quantum dot(s) may be greater than or equal to about 85%. The quantum efficiency of the quantum dot(s) may be greater than or equal to about 90%. The quantum efficiency of the quantum dot(s) may be greater than or equal to about 95%.

A maximum luminescent peak of the quantum dot(s) may have a full width at half maximum of less than or equal to about 37 nm, less than or equal to about 36 nm, or less than or equal to about 35 nm. The full width at half maximum may be less than or equal to about 34 nm, less than or equal to about 33 nm, less than or equal to about 32 nm, less than or equal to about 31 nm, less than or equal to about 30 nm, less than or equal to about 29 nm, or less than or equal to about 28 nm.

The quantum dots may exhibit improved stability (e.g., thermal stability). If the quantum dots may form a film having a predetermined thickness (e.g., three layer of the quantum dots) and then subjected to a thermal treatment at about 150° C. for about 30 minutes, the quantum dots (or the film thereof) may maintain a luminous efficiency of at least about 60%, at least about 70%, at least about 80%, or at least about 90% of an initial efficiency thereof.

In an embodiment, a method of manufacturing the quantum dot(s) includes:

preparing a mixture (a solution or a dispersion) including (dispersing or dissolving) an alkaline earth metal compound (e.g., an alkaline earth metal carboxylate, an alkaline earth metal halide such as an alkaline earth metal chloride, or a combination thereof) and an organic ligand in an organic solvent;

combining a particle including the core and a chalcogen element precursor with the mixture; and heating the mixture and conducting a reaction at a reaction temperature.

The alkaline earth metal precursor may include an alkaline earth metal acetylacetonate, an alkaline earth metal carboxylate, an alkaline earth metal chloride, or a combination thereof.

In an embodiment, the core may be obtained by preparing a zinc precursor mixture, e.g., a solution, including a zinc precursor and an organic ligand; preparing a selenium precursor and a tellurium precursor; heating the zinc precursor mixture to a first reaction temperature (a core formation temperature) and adding the selenium precursor and the tellurium precursor thereto optionally together with an organic ligand to proceed a reaction therebetween.

In an embodiment, the core including the first semiconductor nanocrystal may be obtained by preparing a zinc precursor mixture, e.g., a solution including a zinc precursor and an organic ligand; preparing a selenium precursor and a tellurium precursor; heating the zinc precursor mixture, e.g., solution, to a first reaction temperature and adding the selenium precursor and the tellurium precursor thereto optionally together with an organic ligand to proceed a reaction therebetween.

In an embodiment, the particle including the core may further include a semiconductor nanocrystal shell disposed on the core (for example, a first shell layer including a second semiconductor nanocrystal and optionally a third shell layer including a fourth semiconductor nanocrystal) and by the reaction, a layer including an alkaline earth metal chalcogenide may be formed on the first shell layer or the third shell layer. The second semiconductor nanocrystal and the fourth semiconductor nanocrystal may each independently include a zinc chalcogenide (for example, ZnSe, ZnSeS, ZnS, or a combination thereof). Details of formation of the first shell layer and the third shell layer may refer to details (e.g., reaction temperature, conditions, or a combination thereof and precursors) of the formation of a semiconductor nanocrystal shell, which will be described in detail herein.

The method may further include adding a zinc precursor to the mixture and a shell layer including a zinc alkaline earth metal chalcogenide may be formed by the reaction on the particle including the core (or on the core).

The particle may further include a semiconductor nanocrystal shell layer disposed on the core and a shell layer including a zinc alkaline earth metal chalcogenide may be formed on the semiconductor nanocrystal shell by the reaction.

After the formation of the layer including the alkaline earth metal chalcogenide or the zinc alkaline earth metal chalcogenide, a zinc precursor and a chalcogen precursor may be further added and a reaction therebetween proceeds to provide an outermost layer including a zinc chalcogenide (e.g., a ZnS layer) on the layer including the alkaline earth metal chalcogenide or the zinc alkaline earth metal chalcogenide. Details of formation of the outermost layer may refer to details (e.g., reaction temperature, other conditions, or a combination thereof and precursors) of the formation of a semiconductor nanocrystal shell, which will be described in detail herein.

In an embodiment, the zinc precursor may include a Zn powder, ZnO, an alkylated Zn compound (e.g., C2 to C30 alkyl (e.g., dialkyl) zinc such as dimethyl zinc, diethyl zinc), a Zn alkoxide (e.g., a zinc ethoxide), a Zn carboxylate (e.g., a zinc acetate or zinc aliphatic carboxylate, for example, zinc long chain aliphatic carboxylate such as zinc oleate), a Zn nitrate, a Zn perchlorate, a Zn sulfate, a Zn acetylacetonate, a Zn halide (e.g., a zinc chloride), a Zn cyanide, a Zn hydroxide, zinc carbonate, zinc peroxide, or a combination thereof. Examples of the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, or a combination thereof.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The tellurium precursor may include tellurium-trioctylphosphine (Te-TOP), tellurium-tributylphosphine (Te-TBP), tellurium-triphenylphosphine (Te-TPP), tellurium-diphenylphosphine (Te-DPP), or a combination thereof, but is not limited thereto.

The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), sulfur-octadecene (S-ODE), bis(trimethylsilylmethyl) sulfide, ammonium sulfide, sodium sulfide, or a combination thereof.

The alkaline earth metal acetylacetonate may include barium acetylacetonate, calcium acetylacetonate, magnesium acetylacetonate, strontium acetylacetonate, or a combination thereof.

The alkaline earth metal carboxylate may include a barium carboxylate such as barium oleate, barium stearate, barium laurate, or the like, a calcium carboxylate such as calcium oleate, calcium stearate, or calcium laurate, magnesium carboxylate such as magnesium oleate, magnesium stearate, or magnesium laurate, a strontium carboxylate such as strontium oleate, strontium stearate, or strontium laurate, or a combination thereof. The alkaline earth metal chloride may include barium chloride, calcium chloride, magnesium chloride, strontium chloride, or a combination thereof.

The organic solvent may be a C6 to C22 primary amine such as a hexadecylamine, a C6 to C22 secondary amine such as dioctylamine, a C6 to C40 tertiary amine such as a trioctyl amine, a nitrogen-containing heterocyclic compound such as pyridine, a C6 to C40 olefin such as octadecene, a C6 to C40 aliphatic hydrocarbon such as hexadecane, octadecane, or squalane, an aromatic hydrocarbon substituted with a C6 to C30 alkyl group such as phenyldodecane, phenyltetradecane, or phenyl hexadecane, a primary, secondary, or tertiary phosphine (e.g., trioctyl phosphine) substituted with at least one (e.g., 1, 2, or 3) C6 to C22 alkyl group, a primary, secondary, or tertiary phosphine oxide (e.g., trioctylphosphine oxide) substituted with at least one (e.g., 1, 2, or 3) C6 to C22 alkyl group(s), a C12 to C22 aromatic ether such as a phenyl ether or a benzyl ether, or a combination thereof.

The organic ligand may coordinate, e.g., be bound to, the surface of the produced nanocrystal and may effectively disperse the nanocrystal in the liquid, e.g., solution phase. Therefore, the quantum dot may include the organic ligand e.g., on a surface thereof, for example bound thereto.

The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR', RPO(OH)$_2$, RHPOOH, R$_2$POOH, a polymeric organic ligand, or a combination thereof wherein R and R' are the same or different, and are each independently a C1 to C40 (e.g., C3 to C30 or C6 to C24) substituted or unsubstituted aliphatic hydrocarbon group (alkyl, alkenyl, or alkynyl group) or a C6 to C40 substituted or unsubstituted aromatic hydrocarbon group, or a combination thereof. Two or more different organic ligands may be used.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, palmitic acid, or stearic acid; a phosphine such as a substituted or unsubstituted methylphosphine (e.g., trimethylphosphine, methyldiphenylphosphine, etc.), a substituted or unsubstituted ethylphosphine (e.g., triethylphosphine, ethyldiphenylphosphine, etc.), a substituted or unsubstituted propylphosphine, a substituted or unsubstituted butylphosphine, a substituted or unsubstituted pentylphosphine, or a substituted or unsubstituted octylphosphine (e.g., trioctylphosphine (TOP)); a phosphine oxide such as a substituted or unsubstituted methylphosphine oxide (e.g., trimethylphosphine oxide, methyldiphenylphosphine oxide, etc.), a substituted or unsubstituted ethylphosphine oxide (e.g., triethylphosphine oxide, ethyldiphenylphosphine oxide, etc.), a substituted or unsubstituted propylphosphine oxide, a substituted or unsubstituted butylphosphine oxide, or a substituted or unsubstituted octylphosphine oxide (e.g., trioctylphosphine oxide (TOPO)); diphenylphosphine, diphenylphosphine oxide, triphenylphosphine, or triphenylphosphine oxide; a mono- or di(C5 to C20 alkyl) phosphinic acid such as a mono- or dihexylphosphinic acid, a mono- or dioctylphosphinic acid, a mono- or di(dodecyl) phosphinic acid, a mono- or di(tetradecyl)phosphinic acid, a mono- or di(hexadecyl)phosphinic acid, a mono- or di(octadecyl)phosphinic acid, or a combination thereof; a C5 to C20 alkylphosphinic acid; a C5 to C20 alkylphosphonic acid such as hexylphosphonic acid, octylphosphonic acid, dodecylphosphonic acid, tetradecylphosphonic acid, hexadecylphosphonic acid, octadecylphosphonic acid, or a combination thereof; and the like, but are not limited thereto. Two or more different organic ligand compounds may be used. In an embodiment, the organic ligand compound may be a combination of RCOOH and an amine (e.g., RNH$_2$, R$_2$NH, R$_3$N, or a combination thereof).

In the core including the first semiconductor nanocrystal, a mole ratio of tellurium with respect to selenium may be in the ranges described herein. In order to form the core having a desired ratio of the tellurium to selenium, an amount of the selenium precursor for forming the core may be greater than or equal to about 20 moles, for example, greater than or equal to about 25 moles, greater than or equal to about 26 moles, greater than or equal to about 27 moles, greater than or equal to about 28 moles, greater than or equal to about 29 moles, greater than or equal to about 30 moles, greater than or equal to about 31 moles, greater than or equal to about 32 moles, greater than or equal to about 33 moles, greater than or equal to about 34 moles, greater than or equal to about 35 moles, greater than or equal to about 36 moles, greater than or equal to about 37 moles, greater than or equal to about 38 moles, greater than or equal to about 39 moles, or greater than or equal to about 40 moles, per one mole of the tellurium precursor. The amount of the selenium precursor may be less than or equal to about 60 moles, less than or equal to about 59 moles, less than or equal to about 58 moles, less than or equal to about 57 moles, less than or equal to about 56 moles, or less than or equal to about 55 moles based on one mole of the tellurium precursor. Within the foregoing ranges of the amount, the core having the aforementioned composition may be formed.

The first reaction temperature may be greater than or equal to about 200° C., for example, greater than or equal to about 210° C., greater than or equal to about 230° C., greater than or equal to about 240° C., greater than or equal to about 280° C., or greater than or equal to about 290° C., less than or equal to about 400° C., less than or equal to about 380° C., less than or equal to about 350° C., or less than or equal to about 340° C., or a combination thereof.

A reaction time for forming the core is not particularly limited and may be appropriately selected. For example, the reaction time may be greater than or equal to about 5 minutes, greater than or equal to about 10 minutes, greater than or equal to about 15 minutes, greater than or equal to about 20 minutes, greater than or equal to about 25 minutes, greater than or equal to about 30 minutes, greater than or equal to about 35 minutes, greater than or equal to about 40 minutes, greater than or equal to about 45 minutes, or greater than or equal to about 50 minutes, but is not limited thereto. For example, the reaction time may be less than or equal to about 2 hours, but is not limited thereto. By controlling the reaction time, the size of the core may be controlled.

In an embodiment, the particle included in the mixture may further include a semiconductor nanocrystal shell (e.g., a first shell layer or the like) on the core and in this case, the method further include carrying out a reaction between the zinc precursor and the chalcogen precursor (e.g., a selenium precursor, a sulfur precursor, or a combination thereof) in the presence of the core to prepare the particle.

Reaction conditions (e.g., reaction time and temperature) for forming a (semiconductor nanocrystal) shell layer may be selected appropriately taking into consideration a desired composition of the shell (e.g., a multi-layered shell). In an embodiment, a solvent and optionally an organic ligand may be heated and treated for example under vacuum at a predetermined temperature (e.g., at a temperature of greater than or equal to about 100° C.) and an atmosphere inside a reaction container is changed into an inert gas and then is heated at a predetermined temperature (e.g., at a temperature of greater than or equal to about 100° C., greater than or equal to about 200° C., or greater than or equal to about 300° C.). Then, the core may be added, and shell precursors may be added sequentially or simultaneously to the reaction container and a resulting mixture is heated to a predetermined reaction temperature to carry out a reaction.

A mixture having different ratios of the shell precursors may be sequentially added for a given period of time, e.g., a reaction time, to achieve a desired composition of the quantum dot or to form a gradient or a multi-layered shell on the core. In an embodiment, a first shell layer including a second semiconductor nanocrystal (e.g., including a zinc selenide) may be formed by reacting a zinc precursor and a selenium precursor and then, if desired, a third shell layer including a fourth semiconductor nanocrystal (e.g., including a zinc sulfide) may be formed on the first shell layer by reacting a zinc precursor and a sulfur precursor (optionally together with a selenium precursor).

A reaction temperature for forming the shell may be greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. and less than or equal to about 380° C., less than or equal to about 350° C., less than or equal to about 340° C., less than or equal to about 330° C., or less than or equal to about 325° C.

In a reaction system, an amount and a concentration of the precursor may be selected taking into consideration the compositions of the core and the shell and the reactivity between the precursors. The particle(s) having the core and optionally the shell layer may be separated in substantially the same manner as set forth herein. Ratios between the precursors for the shell formation may be selected taking into consideration a desired shell thickness and a desired composition of the quantum dots and are not particularly limited.

The core including the first semiconductor nanocrystal or the particle including the core and the first shell layer (and optionally the third shell layer) may be combined with an alkaline earth metal precursor (optionally together with a zinc precursor) and a chalcogen element precursor and then a reaction may be conducted to obtain a semiconductor nanocrystal shell including an alkaline earth metal (e.g., a semiconductor nanocrystal shell including an alkaline earth metal zinc chalcogenide, an alkaline earth metal chalcogenide, or a combination thereof).

The reaction may result in an alkaline earth metal chalcogenide. The alkaline earth metal chalcogenide thus formed may exhibit a crystalline peak in an X-ray diffraction analysis of the quantum dot. The chalcogen element precursor may be a sulfur precursor, a selenium precursor, or a combination thereof. The alkaline earth metal chalcogenide thus formed may include an alkaline earth metal sulfide, an alkaline earth metal selenide, or a combination thereof. The alkaline earth metal chalcogenide thus formed may include an alloy of a zinc chalcogenide (e.g., a zinc selenide or a zinc sulfide) and an alkaline earth metal.

The amount of the alkaline earth metal as used may be selected taking into consideration the types of the precursors and the reaction conditions (e.g., a reaction temperature). In an embodiment, the amount of the alkaline earth metal as used may be, per one mole of the zinc, greater than or equal to about 0.005 moles, greater than or equal to about 0.01 moles, or greater than or equal to about 0.015 moles. The amount of the alkaline earth metal as used may be, per one mole of the zinc, less than or equal to about 0.5 moles, less than or equal to about 0.3 moles, or less than or equal to about 0.1 moles.

After the reaction is completed, a non-solvent may be added to the reacted mixture, facilitating separation of the nanocrystal particles coordinated with, e.g., bound to, the organic ligand therefrom. The non-solvent may be a polar solvent that is miscible with the solvent used in the core formation reaction, or the quantum dot formation reaction, and is not capable of dispersing the produced nanocrystals. The non-solvent may be selected taking into consideration the solvent used in the reaction, and may be for example acetone, ethanol, butanol, isopropanol, ethanediol, water, tetrahydrofuran (THF), dimethylsulfoxide (DMSO), diethyl ether, formaldehyde, acetaldehyde, a solvent having a similar solubility parameter to the foregoing non-solvents, or a combination thereof. Separation of the nanocrystal particles may involve centrifugation, sedimentation, chromatography, or filtration. The separated nanocrystal particles may be added to a washing (or dispersing) solvent and washed (or dispersed), if desired.

Types of the washing (dispersing) solvent are not particularly limited and a solvent having a similar solubility parameter to that of the ligand may be used and examples thereof may include hexane, heptane, octane, chloroform, toluene, benzene, or the like.

In an embodiment, the quantum dot may be waterinsoluble or indispersable in water, the aforementioned non-solvent, or a combination thereof.

In an embodiment, the quantum dots may be dispersed in the aforementioned organic solvent (e.g., to form a mixture such as a dispersion or a solution). In an embodiment, the quantum dots may be dispersed in a C3 to C40 (C6 to C24) substituted or unsubstituted aliphatic hydrocarbon, a C6 to C40 substituted or unsubstituted aromatic hydrocarbon, or a combination thereof.

In an embodiment, an electronic device includes the quantum dot(s). The device may include (or may be) a display device, a light emitting diode (LED), an organic light emitting diode (OLED), a quantum dot LED, a sensor, a solar cell, an image sensor, or a liquid crystal display (LCD), but is not limited thereto.

In an embodiment, the electronic device may be (or may include) a photoluminescent element (e.g., a lighting such as a quantum dot sheet or a quantum dot rail or a liquid crystal display (LCD)) or an electroluminescent device (e.g., QD LED).

In an embodiment, the electronic device may include a quantum dot sheet and the quantum dot may be included in the quantum dot sheet (e.g., in a form of a semiconductor nanocrystal-polymer composite).

Figure 2A:
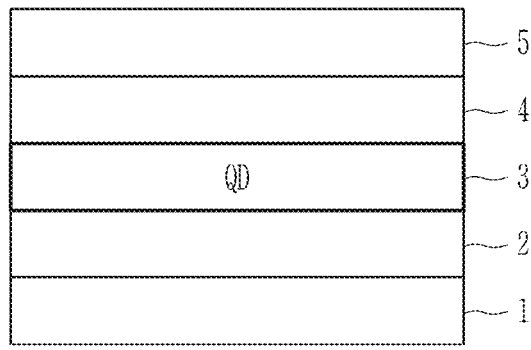
FIG. 2A is a schematic cross-sectional view of a quantum dot (QD) light emitting diode according to an embodiment.

In an embodiment, the electronic device may be an electroluminescent device or a display device including the same. The electroluminescent device or the display device may include an anode 1 and a cathode 5 facing each other and a quantum dot emission layer 3 disposed between the anode and the cathode and including a plurality of quantum dots, and the plurality of quantum dots may include the blue light emitting semiconductor nanocrystal particle (see FIG. 2A).

The cathode may include an electron injection conductor (for example, having a relatively low work function). The anode may include a hole injection conductor (for example, having a relatively high work function). The electron/hole injection conductors may include a metal (e.g., aluminum, magnesium, tungsten, nickel, cobalt, platinum, palladium, or calcium), a metal compound (e.g., LiF), an alloy, or a combination thereof; a metal oxide such as gallium indium oxide or indium tin oxide; or a conductive polymer such as polyethylene dioxythiophene (e.g., having a relatively high work function), but are not limited thereto.

At least one of the cathode and the anode may be a light transmitting electrode or a transparent electrode. In an embodiment, both of the anode and the cathode may be light transmitting electrodes. The electrode may be patterned.

The light transmitting electrode may be made of, for example, a transparent conductor such as indium tin oxide (ITO) or indium zinc oxide (IZO), gallium indium tin oxide, zinc indium tin oxide, titanium nitride, polyaniline, or LiF/Mg:Ag, or a metal thin film of a thin monolayer or multilayer, but is not limited thereto. When one of the cathode and the anode is a non-light transmitting electrode, the cathode or the anode may be made of, for example, an opaque conductor such as aluminum (Al), a lithium aluminum (Li:Al) alloy, a magnesium-silver alloy (Mg:Ag), or a lithium fluoride-aluminum (LiF:Al).

The light transmitting electrode may be disposed on a transparent substrate (e.g., insulating transparent substrate). The substrate may be rigid or flexible. The substrate may be a plastic, glass, or a metal.

The substrate may be a substrate including an insulating material. The substrate may include glass; various polymers such as a polyester (e.g., polyethylene terephthalate (PET), polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

Thicknesses of the anode and the cathode are not particularly limited and may be selected taking into consideration device efficiency. For example, the thickness of the anode (or the cathode) may be greater than or equal to about 5 nm, for example, greater than or equal to about 50 nm, but is not limited thereto. For example, the thickness of the anode (or the cathode) may be less than or equal to about 100 micrometers (μm), for example, less than or equal to about 10 μm, less than or equal to about 1 μm, less than or equal to about 900 nm, less than or equal to about 500 nm, or less than or equal to about 100 nm, but is not limited thereto.

The quantum dot emission layer may include a plurality of quantum dots. The plurality of quantum dots includes a quantum dot of an embodiment. The quantum dot emission layer may include a single layer film of the quantum dots.

The emission layer may be formed by preparing a dispersion including the quantum dots dispersed in a solvent, applying the dispersion via spin coating, ink jet coating, or spray coating, and drying the same. The emission layer may have a thickness of greater than or equal to about 5 nm, for example, greater than or equal to about 10 nm, greater than or equal to about 15 nm, greater than or equal to about 20 nm, or greater than or equal to about 25 nm, and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, or less than or equal to about 30 nm.

The electronic device may include charge (hole or electron) auxiliary layers between the anode and the cathode. For example, the electronic device may include a hole auxiliary layer 2 between the anode and the quantum dot emission layer, an electron auxiliary layer 4 between the cathode and the quantum dot emission layer, or a combination thereof. (see FIG. 2A)

In the figures, the electron/hole auxiliary layer is formed as a single layer, but the electron/hole auxiliary layer is not limited thereto and may include a plurality of layers including at least two stacked layers.

The hole auxiliary layer may include, for example, a hole injection layer (HIL) to facilitate hole injection, a hole transport layer (HTL) to facilitate hole transport, an electron blocking layer (EBL) to inhibit electron transport, or a combination thereof. For example, the hole injection layer may be disposed between the hole transport layer and the anode. For example, the electron blocking layer may be disposed between the emission layer and the hole transport (injection) layer, but is not limited thereto. A thickness of each layer may be selected appropriately. For example, a thickness of each layer may be greater than or equal to about 1 nm, greater than or equal to about 5 nm, greater than or equal to about 10 nm, greater than or equal to about 15 nm, greater than or equal to about 20 nm, or greater than or equal to about 25 nm, and less than or equal to about 500 nm, less than or equal to about 400 nm, less than or equal to about 300 nm, less than or equal to about 200 nm, less than or equal to about 100 nm, less than or equal to about 90 nm, less than or equal to about 80 nm, less than or equal to about 70 nm, less than or equal to about 60 nm, less than or equal to about 50 nm, but is not limited thereto. The hole injection layer may be an organic layer that is formed by a solution process (e.g., spin coating etc.) such as poly(3,4-ethylenedioxythiophene):poly(styrene sulfonate) (PEDOT:PSS). The hole transport layer may be an organic layer that is formed by a solution process (e.g., spin coating, etc.).

The electron auxiliary layer may include, for example, an electron injection layer (EIL) to facilitate electron injection, an electron transport layer (ETL) to facilitate electron transport, a hole blocking layer (HBL) to inhibit hole transport, or a combination thereof. For example, the electron injection layer may be disposed between the electron transport layer and the cathode. For example, the hole blocking layer may be disposed between the emission layer and the electron transport (injection) layer, but is not limited thereto. A thickness of each layer may be selected appropriately. For example, a thickness of each layer may be greater than or equal to about 1 nm and less than or equal to about 500 nm, but is not limited thereto. The electron injection layer may be an organic layer formed by deposition. The electron transport layer may include an inorganic oxide or (nano or fine) inorganic oxide particles or may include an organic layer formed by deposition.

The quantum dot emission layer may be disposed in the hole injection (or transport) layer or an electron injection (or transport) layer. The quantum dot emission layer may be disposed as a separate layer between the hole auxiliary layer and the electron auxiliary layer.

The charge auxiliary layer, the electron blocking layer, and the hole blocking layer may include, for example, an organic material, an inorganic material, or an organic/inorganic material. The organic material may be a compound having hole or electron-related properties. The inorganic material may be, for example, a metal oxide such as molybdenum oxide, tungsten oxide, zinc oxide, or nickel oxide, but is not limited thereto.

The hole transport layer (HTL), the hole injection layer, or a combination thereof may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), a polyarylamine, poly(N-vinylcarbazole) (PVK), polyaniline, polypyrrole, N,N,N',N'-tetrakis (4-methoxyphenyl)-benzidine (TPD), 4,4',-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenyl]cyclohexane (TAPC), a p-type metal oxide (e.g., NiO, $WO_3$, $MoO_3$, etc.), a carbonaceous material such as graphene oxide, or a combination thereof, but is not limited thereto.

The electron blocking layer (EBL) may include, for example, poly(3,4-ethylenedioxythiophene):poly(styrene sulfonate) (PEDOT:PSS), poly(9,9-dioctyl-fluorene-co-N-

(4-butylphenyl)-diphenylamine) (TFB), polyarylamine, poly(N-vinylcarbazole), polyaniline, polypyrrole, N,N,N', N'-tetrakis(4-methoxyphenyl)-benzidine (TPD), 4,4'-bis[N-(1-naphthyl)-N-phenyl-amino]biphenyl (α-NPD), m-MT-DATA, 4,4',4"-tris(N-carbazolyl)-triphenylamine (TCTA), or a combination thereof, but is not limited thereto.

The electron transport layer (ETL), the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, 8-(4-(4,6-di(naphthalen-2-yl)-1,3,5-triazin-2-yl)phenyl)quinolone (ET204), 8-hydroxyquinolinato lithium (Liq), an n-type metal oxide (e.g., a zinc oxide, $HfO_2$, etc.), 8-(4-(4, 6-di(naphthalen-2-yl)-1,3,5-triazin-2-yl)phenyl)quinolone: 8-hydroxyquinolinato lithium (ET204: Liq), 2,2',2"-(1,3,5-Benzenetriyl)-tris(1-phenyl-1H-benzimidazole) (TPBi) or a combination thereof, but is not limited thereto. In the foregoing "q" is 8-hydroxyquinoline, "BTZ" is 2-(2-hydroxyphenyl)benzothiazolate, and "Bq" is 10-hydroxybenzo [h]quinoline.

The hole blocking layer (HBL) may include, for example, 1,4,5,8-naphthalene-tetracarboxylic dianhydride (NTCDA), bathocuproine (BCP), tris[3-(3-pyridyl)-mesityl] borane (3TPYMB), LiF, $Alq_3$, $Gaq_3$, $Inq_3$, $Znq_2$, $Zn(BTZ)_2$, $BeBq_2$, or a combination thereof, but is not limited thereto.

Figure 2B:
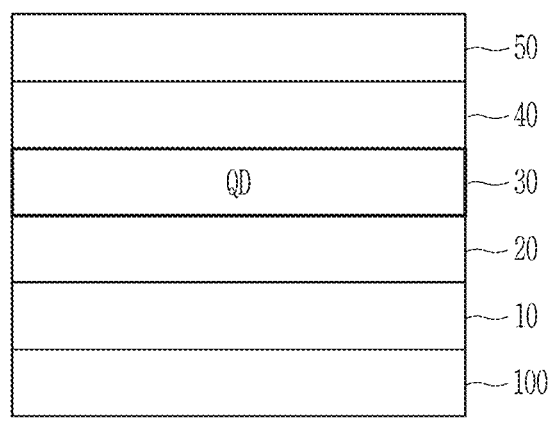
FIG. 2B is a schematic cross-sectional view of a quantum dot light emitting diode according to an embodiment.
Figure 2C:
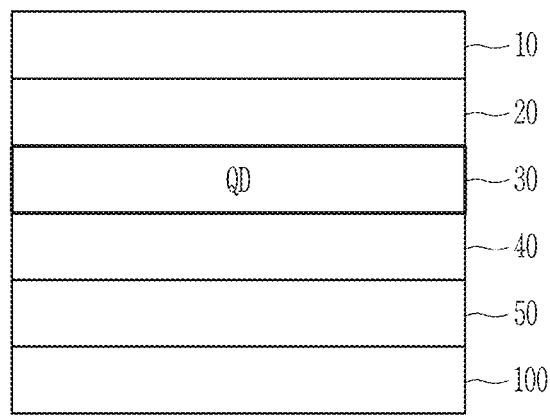
FIG. 2C is a schematic cross-sectional view of a quantum dot light emitting diode according to an embodiment.

In a device according to an embodiment, an anode 10 disposed on a transparent substrate 100 may include a metal oxide transparent electrode (e.g., ITO electrode) and a cathode 50 facing the anode may include a metal (Mg, Al, etc.) of a predetermined (e.g., relatively low) work function. TFB, PVK, or a combination thereof, for example, as a hole transport layer 20 and PEDOT:PSS, a p-type metal oxide, or a combination thereof, for example, as a hole injection layer 20 may be disposed between the transparent electrode 10 and the emission layer 30. An electron auxiliary layer (e.g., electron transport layer) 40 may be disposed between the quantum dot emission layer 30 and the cathode 50. (see FIG. 2B) A device according to an embodiment has an inverted structure. Herein, a cathode 50 disposed on a transparent substrate 100 may include a metal oxide transparent electrode (e.g., ITO) and an anode 10 facing the cathode may include a metal (e.g., Au, Ag, etc.) of a predetermined (e.g., relatively high) work function. For example, an n-type metal oxide (ZnO) may be disposed between the transparent electrode 50 and the emission layer 30 as an electron auxiliary layer (e.g., an electron transport layer) 40. A hole auxiliary layer 20 (e.g., a hole transport layer including TFB, PVK, or a combination thereof; a hole injection layer including $MoO_3$ or another p-type metal oxide; or a combination thereof) may be disposed between the metal anode 10 and the quantum dot emission layer 30. (see FIG. 2C)

In an embodiment, a photoluminescent device or a display device including the same may include a light emitting element (e.g., a photoluminescent element) and optionally a light source, and the light emitting element includes a light emitting layer, which may be optionally disposed on a (transparent) substrate, and the light emitting layer includes a film or a patterned film of the quantum dot composite.

If present, the light source is configured to provide the light emitting element with incident light. The incident light may have a peak wavelength of greater than or equal to about 440 nm, for example, greater than or equal to about 450 nm, greater than or equal to about 455 nm, or greater than or equal to about 460 nm, and less than or equal to about 560 nm, less than or equal to about 500 nm, less than or equal to about 480 nm, less than or equal to about 470 nm, or less than or equal to about 460 nm.

Figure 3:
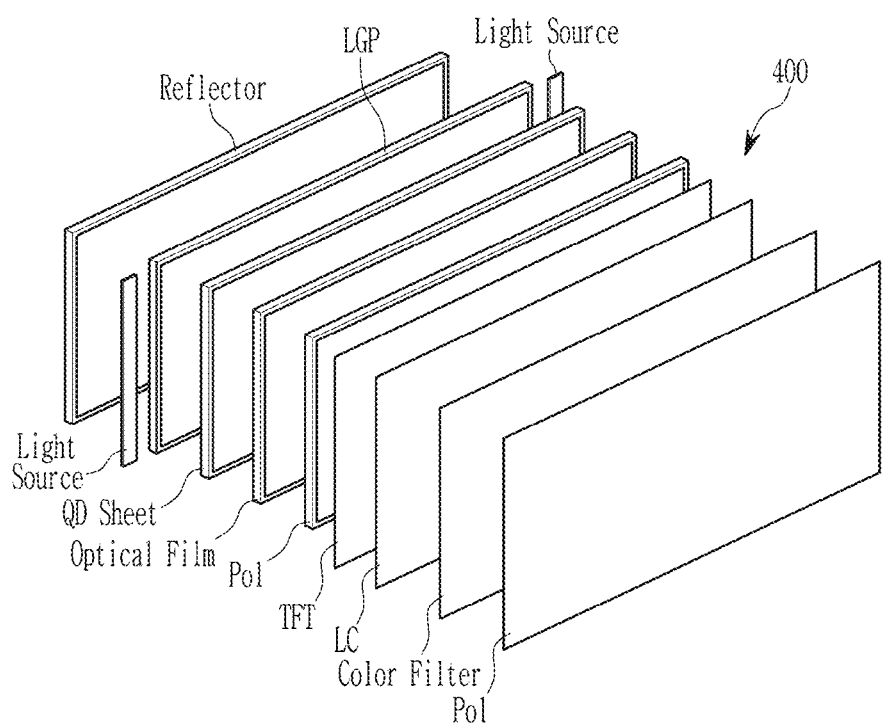
FIG. 3 is an exploded view of a display device according to an embodiment.

In an embodiment, the light emitting element or the light emitting layer may include a sheet of the quantum dot composite. Referring to FIG. 3, which shows an exploded view of an embodiment of a display device 400, a photoluminescent type of device of an embodiment may have a structure wherein a reflector, a light guide panel (LGP), a blue LED light source (blue-LED), the quantum dot-polymer composite sheet (QD sheet), and various optical films such as a prism, double brightness enhance film (DBEF), and the like are stacked and a liquid crystal panel is disposed thereon. The liquid crystal panel may have a structure including a thin film transistor (TFT), a liquid crystal (LC), and a color filter between two polarizers (Pol).

Figure 4A:
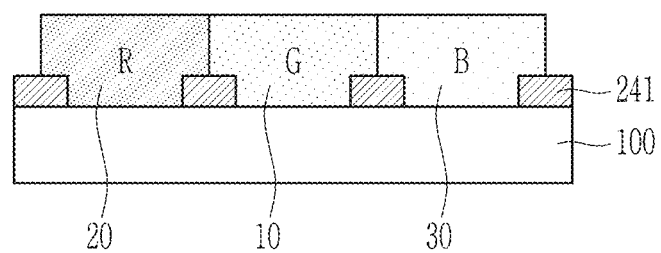
FIG. 4A is a schematic cross-sectional view of a quantum dot composite pattern in a light emitting device of an embodiment.

In an embodiment, the light emitting layer may include the quantum dot-polymer composite pattern. The pattern may include at least one repeating section to emit light of a predetermined wavelength. (see FIG. 4A) In the light emitting device/the display device of an embodiment, a layered structure including a quantum dot composite pattern and a substrate may be disposed over a light emitting source. The quantum dot composite pattern may include a first repeating section 10 including a first light (G) emitting quantum dot, a second repeating section 20 including a second light (R) emitting quantum dot, and a third repeating section 30 that may include a third light (B) emitting quantum dot, is configured to transmit the third light, or a combination thereof. The layered structure includes a black matrix 241 between each of the sections. The repeating sections are disposed on a substrate 100.

In the photoluminescent device or a display device including the same, the light source may include an element that emits light of a predetermined wavelength (e.g., excitation light). The light source may include an LED. The light source may include an organic LED (e.g., OLED).

The light source may include a plurality of light emitting units respectively corresponding to the first section and the second section, and each of the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device such as the organic light emitting diode (OLED) are not particularly limited.

Figure 4B:
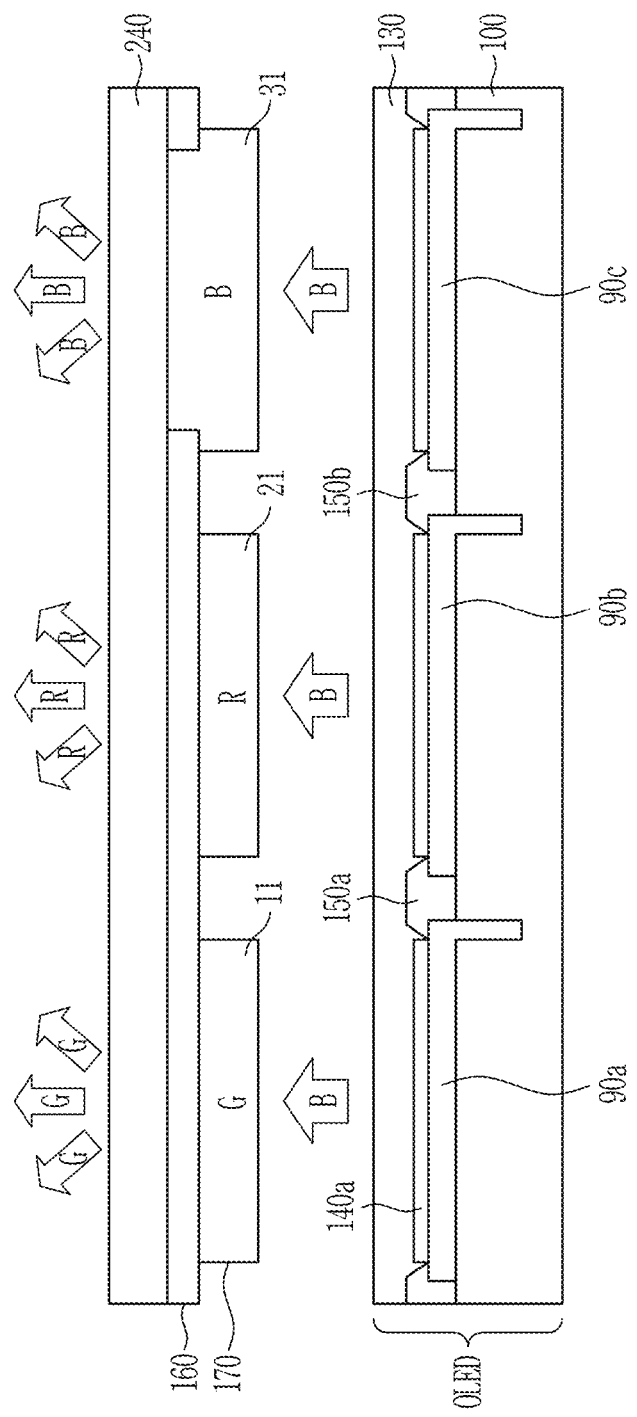
FIG. 4B is a schematic cross-sectional view of an electronic device according to an embodiment.
Figure 4C:
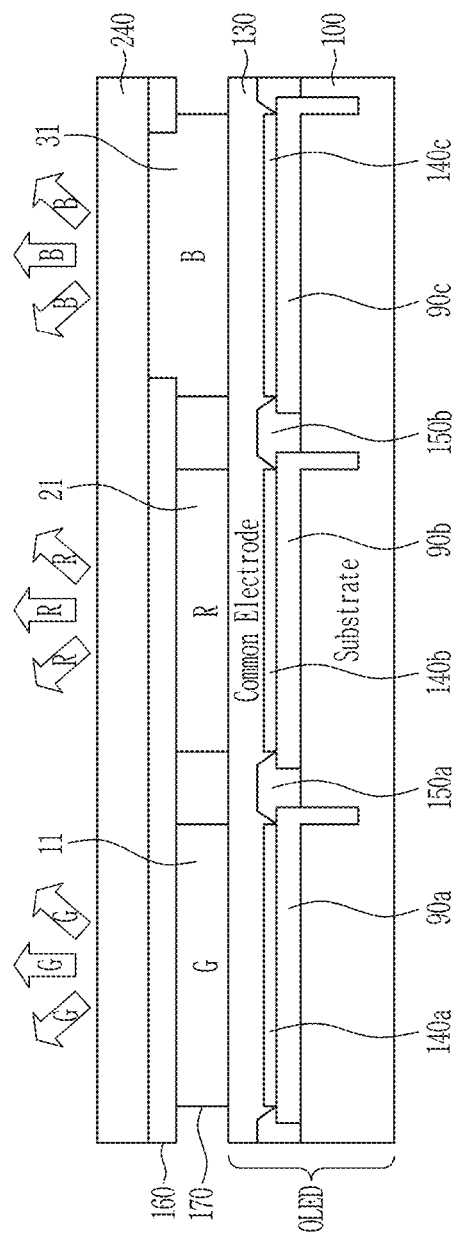
FIG. 4C is a schematic cross-sectional view of an electronic device according to an embodiment.

FIG. 4B is a schematic cross-sectional view of a display device according to an embodiment, and FIG. 4C is a schematic cross-sectional view of a display device according to an embodiment. Referring to FIGS. 4B and 4C, a light source includes an organic light emitting diode (OLED) emitting light of a short wavelength (e.g., blue light, green light, or blue light and green light). The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c. A thin film transistor and a substrate may be disposed under the organic light emitting diode (OLED). The pixel areas of the OLED may be disposed corresponding to the first, second, and third sections that will be described in detail herein, respectively.

A quantum dot composite pattern (e.g., including a first repeating section including first light emitting quantum dots, a second repeating section including second light emitting quantum dots, or a combination thereof) may be disposed for example as a stacked structure further including a substrate, for example, on (e.g., directly on) or over the light source if present.

The light (e.g., blue light, green light, or a combination thereof) emitted from the light source may enter the second section 21 and the first section 11 of the pattern 170 (e.g., QD color filter (C/F)) to emit (e.g., converted) second light (e.g., red light R) and first light (e.g., green light G), respectively. The blue light B emitted from the light source passes through or transmits from the third section 31.

Over the second section 21 emitting red light, the first section 11 emitting green light, or a combination thereof, an excitation light cut layer or optical element 160 (e.g., blue light filter) may be disposed. The optical element may be an excitation light cut layer or a first optical filter, which cuts (e.g., reflects or absorbs) the excitation light (e.g., blue light, green light, or a combination thereof). The excitation light cut layer or optical element 160 may be disposed on the upper substrate 240, or as shown, the excitation light cut layer 160 may be disposed under the upper substrate 240 (e.g., on a bottom surface of the upper substrate 240). The excitation light cut layer 160 may be disposed between the upper substrate 240 and the quantum dot-polymer composite pattern and over the first section 11 and the second section 21 and if desired, the third section 31. Details of the excitation light cut layer are the same as set forth for the first optical filter herein.

The display device may be obtained by separately fabricating the stacked structure and (e.g., blue light emitting) LED or OLED and then assembling the same. Alternatively, the display device may be obtained by forming a quantum dot-polymer composite pattern directly on the LED or OLED.

Details of the substrate are the same as set forth herein. A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking property such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may overlap with a terminal end of the pixel electrode to divide the pixel electrode into a pixel unit. The pixel define layer is an insulation layer which may electrically block the at least two pixel electrodes.

The pixel define layer covers a part of the upper surface of the pixel electrode, and the remaining region of the pixel electrode not covered by the pixel define layer may provide an opening. An organic emission layer that will be described herein may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer. For example, in the display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belonging to a visible light region or belonging to an ultraviolet (UV) region. That is, each of the first to the third pixel areas of the organic emission layer may emit a third light. In an embodiment, the third light may be a light having a higher energy in the visible light region, for example, may be blue light, and optionally green light. When all pixel areas of the organic emission layer are designed to emit the same light, each pixel area of the organic emission layer may be all formed of the same or similar materials or may exhibit the same or similar properties. A process difficulty of forming the organic emission layer may be decreased, and the display device may be applied for, e.g., formed by or used in, a large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include a (e.g., transparent) insulating material for ensuring electrical insulation with the common electrode.

Figure 5:
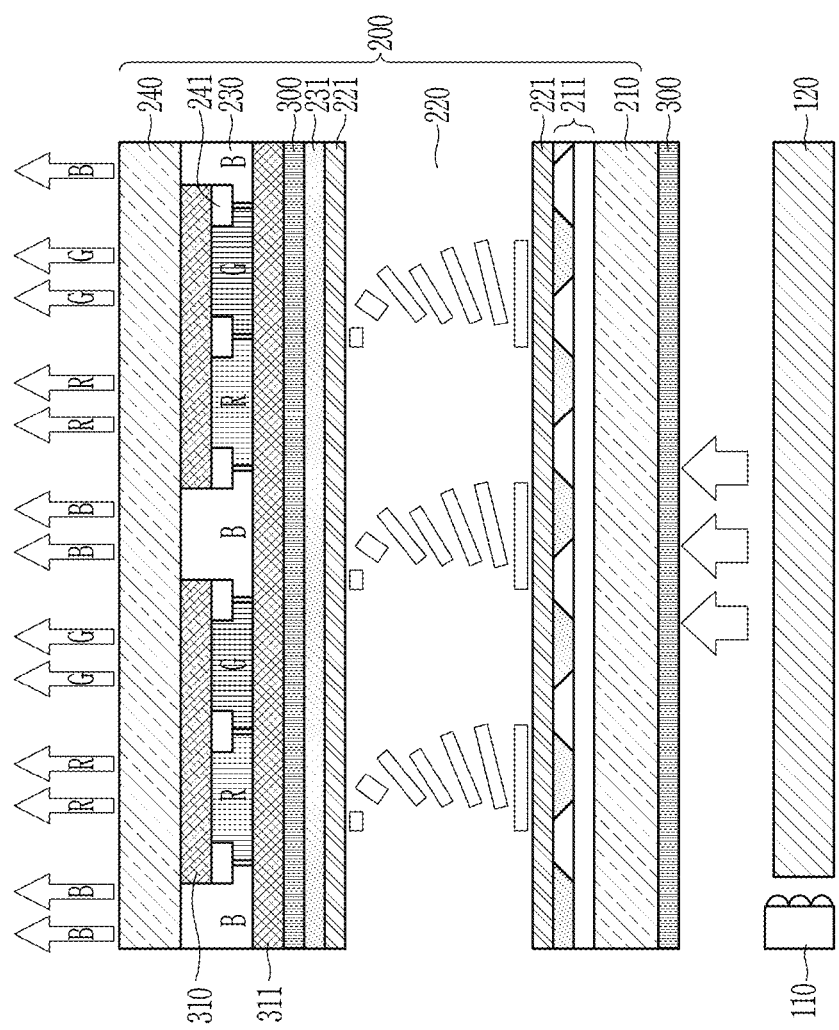
FIG. 5 is a schematic cross-sectional view of an electronic device (e.g., a display device) according to an embodiment.

In an embodiment, a display device (e.g., a liquid crystal display device) will be explained with reference to a figure. Referring to FIG. 5, the display device may include a lower substrate 210, an optical element (e.g., polarizer) 300 disposed below the lower substrate 210, and a liquid crystal layer 220 interposed between a stacked structure and the lower substrate 210. The stacked structure may be disposed in such a manner that a light emitting layer (i.e., the quantum dot-polymer composite pattern) faces the liquid crystal layer. The display device may further include an optical element (e.g., polarizer) 300 between the liquid crystal layer 220 and the light emitting layer. Materials and structures of the polarizer 300 are not particularly limited. The light source 110 may further include an LED and optionally a light guide panel 120. As shown, the backlight unit (e.g., emitting blue light) may be disposed under the polarizer 300.

The stacked structure includes a transparent substrate (or an upper substrate) 240 and a light emission layer (hereinafter, also referred to as photoluminescent layer) 230 including a pattern including a quantum dot-polymer composite.

The lower substrate 210 (also referred to as an array substrate) may be a transparent insulating material substrate. The substrate is the same as described herein. A wire plate 211 is provided on an upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

An upper optical element or an upper polarizer 300 may be provided between the liquid crystal layer 220 and the light emission layer 230. The polarizer may be any suitable polarizer that used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light (shown) or white light. The light source may include a blue (or green) LED, a (white) LED, a (white) OLED, or a combination thereof, but is not limited thereto.

The backlight unit may further include a light guide panel 120. In an embodiment, the backlight unit may be an edge-type lighting. For example, the backlight unit may include a reflector, a light guide panel provided on the reflector and providing a planar light source with the liquid crystal panel 200, at least one optical sheet on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector, and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer may further include at least one fourth section. The fourth section may include a quantum dot that emits light of different color from light emitted from the first to third sections (e.g., cyan, magenta, and yellow light).

In the light emission layer 230, sections forming a pattern may be repeated corresponding to pixel areas formed on the lower substrate. A transparent common electrode 231 may be provided on the photoluminescent layer 230 (e.g., photoluminescent color filter layer).

The third section (B) configured to emit/transmit blue light may be a transparent color filter that does not change a light emitting spectrum of the light source. In this case, blue light emitted from the backlight unit may enter in a polarized state and may be emitted through the polarizer and the liquid crystal layer. If desired, the third section may include a quantum dot emitting blue light.

As explained herein, if desired, the display device or the light emitting device may further include an excitation light blocking layer or a first optical filter layer (herein, referred to as a first optical filter layer). The first optical filter layer may be disposed between bottom surfaces of the first section (R) and the second section (G) and a substrate (e.g., the upper substrate 240) or on a top surface of a substrate (e.g., the upper substrate 240). The first optical filter layer may include a sheet having openings that correspond to a pixel area showing a blue color (e.g., third section). In other words, the first optical filter layer may be integrally formed as one body structure at the portions except portions overlapped with the third section, but is not limited thereto. At least two (e.g., three) first optical filter layers may be spaced apart and be disposed on each of the positions overlapped with the first and the second sections and optionally the third section. When the light source includes a green light emitting element, a green light cut filter layer may be disposed on the third section.

In an embodiment, the first optical filter layer 310 may block light having a portion of a wavelength region in the visible light region. The first optical filter layer may transmit light having other (visible light) wavelength regions. For example, the first optical filter layer may block blue light (or green light) and transmit light except blue (or green) light. For example, the first optical filter layer may transmit green light, red light, or yellow light that is mixed light thereof. The first optical filter layer may transmit blue light and block the green light and may be disposed on the blue light emitting pixel.

In an embodiment, the first optical filter layer may substantially block excitation light and may transmit light of desired wavelength. In an embodiment, the first optical filter layer may have light transmittance of greater than or equal to about 70%, greater than or equal to about 80%, greater than or equal to about 90%, or about 100% with respect to a light of a desired wavelength range.

In an embodiment, a first optical filter layer selectively transmitting red light may be disposed on the portion overlapped with the section emitting red light and the first optical filter layer selectively transmitting green light may be disposed on the portion overlapped with the section emitting green light, respectively. In an embodiment, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). In an embodiment, the excitation light may include blue light and green light, and a first optical filter layer may further include a third region that blocks the green light and selectively transmit blue light.

The first region may be disposed at a place overlapped with the section emitting green light. The second region may be disposed at a place overlapped with the section emitting red light. The third region may be disposed at a place overlapped with the section emitting or transmitting blue light.

The first region, the second region, and optionally the third region may be optically isolated. The first optical filter layer may contribute to improving color purity of a display device.

The display device may further include a second optical filter layer 311 (e.g., red/green light or yellow light recycling layer) that is disposed between the light emitting layer 230 and the liquid crystal layer 220, and between the light emitting layer 230 (e.g., the quantum dot polymer composite layer) and the upper polarizer 300. The second optical filter layer 311 may transmit at least a portion of a third light (i.e., excitation light), and reflect at least a portion of a first light, a second light, or a first light and a second light. The first light may be red light. The second light may be green light. The third light may include blue light. The second optical filter layer may transmit the third light (B) of a blue light wavelength range having a wavelength of less than or equal to 500 nm. Light of a wavelength range of greater than about 500 nm (e.g., red light R, green light G, or yellow light) may not be allowed to pass the second optical filter and may be reflected thereby. The reflected green light and red light is then transmitted through the first and second sections and is emitted out of the display device.

In the display device according to an embodiment, the first optical filter layer, the second optical filter layer, or the first optical filter layer and the second optical filter layer may be formed as an integrated single layer having an approximately planar surface.

In an embodiment, the first optical filter layer may include a dye capable of absorbing light of a predetermined wavelength to be blocked, pigment capable of absorbing light of a predetermined wavelength to be blocked, or a combination thereof. The first optical filter layer, the second optical filter layer, or the first optical filter layer and the second optical filter layer may include a monolayer having a low refractive index, for example, and it may be a transparent thin film having a refractive index of less than or equal to about 1.4, less than or equal to about 1.3, or less than or equal to about 1.2. The first or second optical filter layer having a low refractive index may be, for example, a porous silicon oxide, a porous organic material, a porous organic/inorganic composite, or a combination thereof.

In an embodiment, the first or second optical filter layer may, each independently, include a plurality of layers having different refractive indexes, for example, the first or second optical filter layer may be formed by alternately stacking two layers having different refractive indexes, or for example, the second or first optical filter layer may be formed by alternately stacking a material having a high refractive index and a material having a low refractive index.

Hereinafter, the embodiments are illustrated in more detail with reference to examples. However, they are exemplary examples of the present disclosure, and the present disclosure is not limited thereto.

EXAMPLES

Analysis Method
1. Photoluminescence Analysis

A photoluminescence (PL) spectrum of the produced nanocrystals are obtained using a Hitachi F-7000 spectrophotometer at an irradiation wavelength of 372 nanometers (nm).

2. Inductively Coupled Plasma (ICP) Analysis

An inductively coupled plasma-atomic emission spectroscopy (ICP-AES) analysis is performed using Shimadzu ICPS-8100.

3. X-ray photoelectron Spectroscopy (XPS) Analysis

An X-ray photoelectron Spectroscopy analysis is performed using Quantum 2000 manufactured by Physical Electronics.

4. Transmission Electron Microscopy-Energy-Dispersive X-ray (TEM-EDX) Analysis

A TEM-EDX analysis is performed using Tecnai G2 F20 S-TWIN (a 200 kV field emission gun (FEG) high resolution TEM/Scanning Transmission Electron Microscopy (STEM)).

Synthesis is performed under an inert gas atmosphere (or nitrogen flowing condition) unless particularly stated otherwise.

Example 1-1

1, Selenium, sulfur, and tellurium are dispersed in trioctylphosphine (TOP) to obtain a 2 molar (M) Se/TOP stock solution, 2 M S/TOP stock solution, and a 0.5 M Te/TOP stock solution.

In a 300 milliliters (mL) reaction flask, zinc acetate and palmitic acid are dissolved in trioctylamine and is heated under vacuum at 120° C. After one hour, the atmosphere in the flask is replaced with an inert gas (nitrogen), and then the reaction flask is heated to 300° C.

To the heated reaction flask the Se/TOP stock solution and the Te/TOP stock solution is quickly injected and a reaction proceeds for 60 minutes, after which the reactor is cooled to room temperature and acetone is added to facilitate the forming of a precipitate, which is separated via centrifugation to provide a ZnSeTe core. The obtained core is then dispersed in toluene.

A mole ratio between the zinc precursor and the selenium precursor is 2:1 (Zn:Se) and a mole ratio between the tellurium precursor and the selenium precursor is 0.07:1 (Te:Se).

2. To a 300 mL reaction flask, trioctylamine (TOA), zinc acetate, and oleic acid are added, and the mixture is vacuum treated at 120° C. for one hour. The atmosphere in the flask is replaced with an inert atmosphere (nitrogen). While heating the flask to a temperature to about 300° C., the ZnTeSe core is added quickly and then the Se/TOP stock solution is added, and the reaction proceeds for 120 minutes to form a ZnSe layer on the core. A mole ratio between the zinc precursor and the selenium precursor used in the formation of the shell layer is about 2:85:1.5.

The flask is cooled to room temperature and acetone is added to facilitate formation of a precipitate, and the ZnTeSe/ZnSe particles are separated via centrifugation. The separated particles are dispersed in toluene.

3. Trioctylamine (TOA) is placed in a 300 mL reaction flask, and barium acetate and oleic acid are added thereto and the mixture is vacuum-treated at 120° C. The atmosphere in the flask is replaced with nitrogen. While heating the flask, a toluene dispersion of ZnTeSe/ZnSe particle and the S/TOP stock solution are added one by one and at a temperature of about 340° C., a reaction proceeds for 20 minutes to form a BaS layer on the particle. An amount of the barium precursor used during the quantum dot formation is about 0.3 moles, per one mole of zinc.

The flask is cooled to room temperature and acetone is added to facilitate formation of a precipitate, and the ZnTeSe/ZnSe particles are separated via centrifugation. The separated particles are dispersed in toluene.

With respect to the quantum dots an ICP-AES analysis is conducted and the results are shown in Table 2.

With respect to the quantum dots as prepared, a photoluminescent spectroscopy analysis is conducted and the results are summarized in Table 3.

An XPS analysis is made for the quantum dots and the results are shown in FIG. 1A. The results of FIG. 1A confirm that the barium sulfide is formed in the quantum dot.

Comparative Example 1

A ZnSe layer is formed on the ZnSeTe core in the same manner as in Example 1. Then, instead of the barium precursor, S/TOP stock solution is added to the reaction medium together with zinc acetate and a reaction continues about 120 minutes to form a ZnS layer on the ZnSe layer. During the shell formation, a mole ratio among the Zn precursor, the S precursor, and the Se precursor as used is 4.05:1.2:1.2.

With respect to the quantum dots an ICP-AES analysis is conducted and the results are shown in Table 2.

With respect to the quantum dots as prepared, a photoluminescent spectroscopy analysis is conducted and the results are summarized in Table 3.

Example 1-2

A ZnSe layer is formed on the ZnSeTe core in the same manner as in Example 1. Then, S/TOP stock solution is added to the reaction medium together with zinc acetate and a reaction continues about 120 minutes to form a ZnS layer on the ZnSe layer. During the shell formation, a mole ratio among the Zn precursor, the S precursor, and the Se precursor as used is 4.05:1.2:1.2.

Trioctylamine (TOA) is placed in a 300 mL reaction flask, and barium acetate and oleic acid are added thereto and the mixture is vacuum-treated at 120° C. The atmosphere in the flask is replaced with nitrogen. While heating the flask, a toluene dispersion of ZnTeSe/ZnSe/ZnS particle and the S/TOP stock solution are added one by one and at a temperature of about 280° C., a reaction proceeds for 60 minutes to form a BaS layer on the particle. An amount of the barium precursor used during the quantum dot formation is about 0.12 moles, per one mole of zinc.

With respect to the quantum dots an ICP-AES analysis is conducted and the results are shown in Table 2.

Figure 1B:
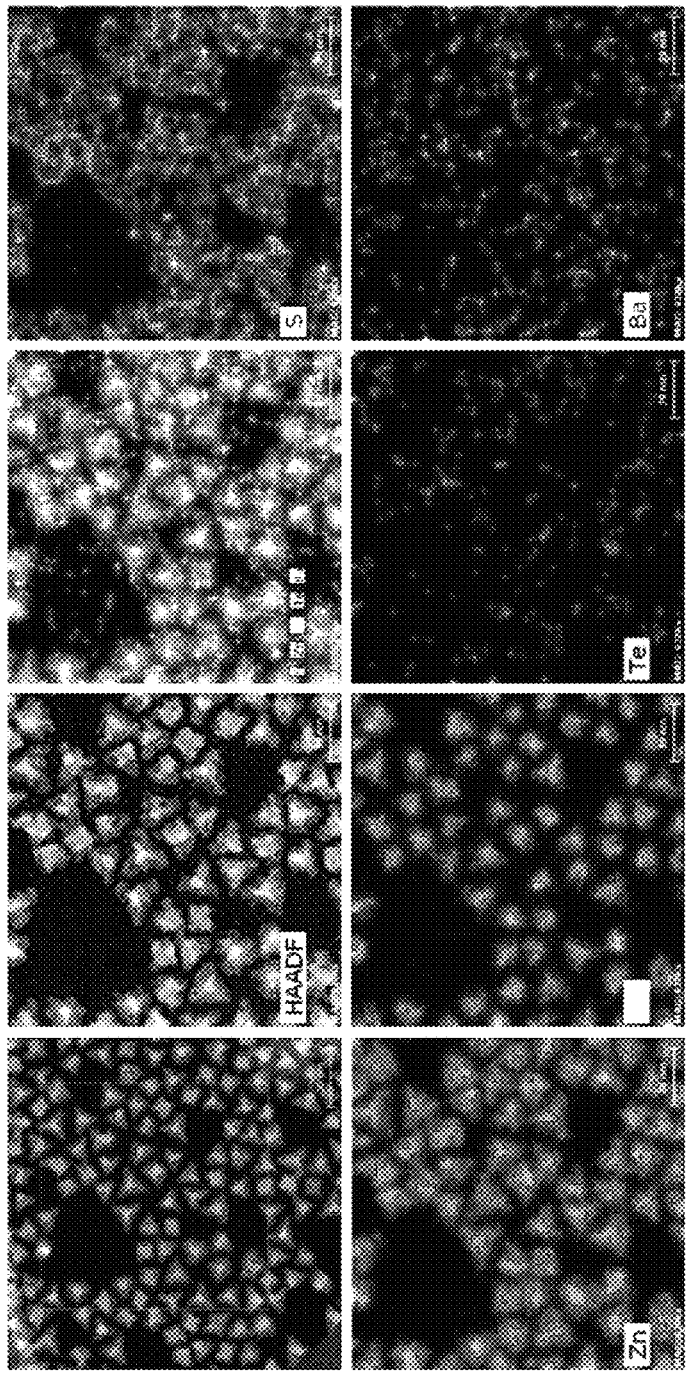
FIG. 1B shows a result of a Transmission Electron Microscopy-Energy-dispersive X-ray spectroscopy for the quantum dots prepared by Example 1-2.

A TEM-EDX analysis is made for the quantum dots and the results are shown in FIG. 1B.

With respect to the quantum dots as prepared, a photoluminescent spectroscopy analysis is conducted and the results are summarized in Table 3.

TABLE 2

| | Mole ratio | | | | |
|---|---|---|---|---|---|
| | S:Zn | Zn:Zn | Se:Zn | Te:Zn | Ba:Zn |
| Example 1-1 | 0.091:1 | 1:1 | 0.764:1 | 0.002:1 | 0.05:1 |
| Example 1-2 | 0.318:1 | 1:1 | 0.517:1 | 0.004:1 | 0.02:1 |
| Comparative Example 1 | 0.358:1 | 1:1 | 0.521:1 | 0.002:1 | 0:1 |

TABLE 3

| Quantum Dot (QD) structure | | Photoluminescent properties | |
|---|---|---|---|
| | | Wavelength (nm) | PL QY(%) |
| Comparative Example 1 | ZnTeSe/ZnSe/ZnS | 452 | 84 |
| Example 1-1 | ZnTeSe/ZnSe/BaS | 463 | 90 |
| Example 1-2 | ZnTeSe/ZnSe/ZnS/BaS | 458 | 94 |

PL QY: photoluminescent quantum yield

Experimental Example 1

Using each of the quantum dot dispersion of Example 1 and the quantum dot dispersion of Comparative Example 1, a quantum dot thin film having a thickness of about 30 nm is formed respectively, and the resulting film is subjected to a thermal treatment at 150° C. for 30 minutes. Prior to and after the thermal treatment, the quantum efficiency of each thin film is measured and a quantum efficiency maintenance ratio is evaluated.

The results show that the quantum efficiency maintenance ratio of the thin film including the quantum dots of Example 1 is about 87% while the quantum efficiency maintenance ratio of the thin film including the quantum dots of Comparative Example 1 is about 62%

Example 2

1. A ZnSeTe core is prepared in the same manner as Example 1-1.

2. Trioctylamine (TOA) is placed in a 300 mL reaction flask, and zinc acetate, oleic acid, and calcium chloride are added thereto and the mixture is vacuum-treated at 120° C. The atmosphere in the flask is replaced with nitrogen. While heating the flask to 300° C., a toluene dispersion of ZnTeSe particle is quickly added and then, the Se/TOP stock solution is added and a reaction proceeds for 120 minutes to form a CaZnSe layer on the core.

Then, zinc acetate and S/TOP are added to the reaction medium and is reacted for 120 minutes to form a ZnS layer on the CaZnSe layer.

A mole ratio among the Zn precursor, the S precursor, and the Se precursor is 4.05:2.8:1.5.

An amount of the CaCl$_2$ used during the quantum dot formation is about 0.04 moles, per one mole of zinc.

With respect to the quantum dots an ICP-AES analysis is conducted and the results are shown in Table 4.

With respect to the quantum dots as prepared, a photoluminescent spectroscopy analysis is conducted and the results are summarized in Table 5.

Example 3

A quantum dot is prepared in the same manner as in Example 2 except for using barium oleate instead of calcium chloride.

An amount of the barium oleate used during the quantum dot formation is about 0.02 moles, per one mole of zinc.

With respect to the quantum dots an ICP-AES analysis is conducted and the results are shown in Table 4.

With respect to the quantum dots as prepared, a photoluminescent spectroscopy analysis is conducted and the results are summarized in Table 5.

Example 4

A quantum dot is prepared in the same manner as in Example 2 except for using magnesium chloride instead of calcium chloride.

An amount of the $MgCl_2$ used during the quantum dot formation is about 0.04 moles, per one mole of zinc.

With respect to the quantum dots an ICP-AES analysis is conducted and the results are shown in Table 4.

With respect to the quantum dots as prepared, a photoluminescent spectroscopy analysis is conducted and the results are summarized in Table 5.

TABLE 4

| | Mole ratio | | | | |
| --- | --- | --- | --- | --- | --- |
| | S:Zn | Zn:Zn | Se:Zn | Te:Zn | Mole ratio |
| Example 2 | 0.376:1 | 1:1 | 0.472:1 | 0.005:1 | Ca:Zn = 0.04:1 |
| Example 3 | 0.38:1 | 1:1 | 0.489:1 | 0.004:1 | Ba:Zn = 0.005:1 |
| Example 4 | 0.354:1 | 1:1 | 0.478:1 | 0.005:1 | Mg:Zn = 0.02:1 |

TABLE 5

| | | results | |
| --- | --- | --- | --- |
| | structure | wavelength (nm) | PLQY (absolute) (%) |
| Example 2 | ZnTeSe/CaZnSe/ZnS | 465 | 99 |
| Example 3 | ZnTeSe/BaZnSe/ZnS | 458 | 96 |
| Example 4 | ZnTeSe/MgZnSe/ZnS | 466 | 93 |

The results of Table 4 and Table 5 confirm that the quantum dots of Examples 2-4 exhibit significantly improved quantum efficiency in comparison with the quantum dots of Comparative Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a core comprising a first semiconductor nanocrystal, and
a semiconductor nanocrystal shell disposed on the core, a composition of the semiconductor nanocrystal shell being different from a composition of the first semiconductor nanocrystal,
wherein the quantum dot does not comprise cadmium,
wherein the semiconductor nanocrystal shell comprises a zinc chalcogenide,
wherein the zinc chalcogenide comprises selenium, tellurium, sulfur, or a combination thereof,
wherein the quantum dot further comprises an alkaline earth metal,
wherein the first semiconductor nanocrystal does not comprise an indium phosphide,
wherein the first semiconductor nanocrystal comprises zinc, tellurium, and selenium,
wherein in the quantum dot, a mole ratio of tellurium with respect to selenium is greater than 0:1 and less than or equal to about 0.1:1, and
wherein in the quantum dot, an amount of the alkaline earth metal is greater than or equal to about 0.001 moles and less than or equal to 0.5 moles, per one mole of zinc.

2. The quantum dot of claim 1, wherein the quantum dot does not comprise a Group III-V compound.

3. The quantum dot of claim 1, wherein the alkaline earth metal comprises barium, strontium, calcium, or a combination thereof.

4. The quantum dot of claim 3, wherein in the quantum dot, a mole ratio of tellurium with respect to selenium is greater than 0:1 and less than or equal to about 0.05:1.

5. The quantum dot of claim 1, wherein the alkaline earth metal comprises barium, strontium, calcium, magnesium, or a combination thereof.

6. The quantum dot of claim 5, wherein the alkaline earth metal is present in the semiconductor nanocrystal shell.

7. The quantum dot of claim 1, wherein in the quantum dot, an amount of the alkaline earth metal is greater than or equal to about 0.001 moles and less than or equal to 0.3 moles, per one mole of zinc.

8. The quantum dot of claim 1, wherein the quantum dot comprises a barium sulfide, a calcium sulfide, a magnesium sulfide, a calcium selenide, a barium selenide, a barium zinc selenide, a calcium zinc selenide, a magnesium zinc selenide, or a combination thereof.

9. The quantum dot of claim 1, wherein the semiconductor nanocrystal shell comprises
a first shell layer disposed on the core, and
a second shell layer disposed on the first shell layer, the first shell layer comprising a second semiconductor nanocrystal and the second shell layer comprising a third semiconductor nanocrystal different from the second semiconductor nanocrystal.

10. The quantum dot of claim 9, wherein
the second semiconductor nanocrystal comprises zinc and selenium, and optionally sulfur, and
the third semiconductor nanocrystal comprises sulfur, and
the second semiconductor nanocrystal, the third semiconductor nanocrystal, or a combination thereof comprises the alkaline earth metal.

11. The quantum dot of claim 9, wherein
the second shell layer is an outermost layer, and
the third semiconductor nanocrystal comprises a zinc sulfide, an alkaline earth metal sulfide, or a combination thereof.

12. The quantum dot of claim 9, wherein the second semiconductor nanocrystal comprises a zinc selenide.

13. The quantum dot of claim 1, wherein a photoluminescent peak wavelength of the quantum dot is less than or equal to about 580 nanometers.

14. The quantum dot of claim 1, wherein a photoluminescent peak wavelength of the quantum dot is less than or equal to about 480 nanometers.

15. The quantum dot of claim 1, wherein the quantum dot has a size of greater than or equal to about 7 nanometers and less than or equal to about 50 nanometers.

16. The quantum dot of claim 1, wherein the quantum dot has a quantum efficiency of greater than or equal to about 80%.

17. The quantum dot of claim 1, wherein the quantum dot has a quantum efficiency of greater than or equal to about 95%.

18. The quantum dot of claim 1, wherein a full width at half maximum of a photoluminescent peak of the quantum dot is less than or equal to about 35 nanometers.

19. The quantum dot of claim 1, wherein
the quantum dot comprises selenium and sulfur, and
in the quantum dot, a mole ratio of sulfur to selenium is greater than or equal to about 0.05:1 and less than or equal to 2:1.

20. A method of manufacturing the quantum dot of claim 1, the method comprising:
preparing a mixture comprising
an alkaline earth metal compound and
an organic ligand in an organic solvent;
combining a particle comprising the core and a chalcogen element precursor with the mixture; and
heating the mixture to conduct a reaction at a reaction temperature and manufacture the quantum dot.

21. The method of claim 20, wherein the method further comprises adding a zinc precursor to the mixture and wherein a shell layer comprising a zinc alkaline earth metal chalcogenide is formed by the reaction on the particle comprising the core.

22. The method of claim 20, wherein the particle further comprises a semiconductor nanocrystal shell layer disposed on the core and a shell layer comprising a zinc alkaline earth metal chalcogenide is formed on the semiconductor nanocrystal shell layer by the reaction.

23. An electroluminescent device comprising:
a first electrode and a second electrode each having a surface opposite the other, and
a quantum dot emission layer disposed between the first electrode and the second electrode, the quantum dot emission layer comprising a plurality of quantum dots, wherein the plurality of quantum dots comprises the quantum dot of claim 1.

24. An electronic device comprising
a light emitting element, and
optionally a light source
wherein the light emitting element comprises a plurality of quantum dots, wherein the plurality of quantum dots comprises the quantum dot of claim 1.

* * * * *